(12) United States Patent
Kato et al.

(10) Patent No.: US 11,532,737 B2
(45) Date of Patent: Dec. 20, 2022

(54) SEMICONDUCTOR DEVICE

(71) Applicant: FUJI ELECTRIC CO., LTD., Kanagawa (JP)

(72) Inventors: Yoshiharu Kato, Matsumoto (JP); Hidenori Takahashi, Matsumoto (JP); Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 114 days.

(21) Appl. No.: 15/908,843

(22) Filed: Mar. 1, 2018

(65) Prior Publication Data

US 2018/0269315 A1 Sep. 20, 2018

(30) Foreign Application Priority Data

Mar. 15, 2017 (JP) ................................ 2017-050462

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0615* (2013.01); *H01L 29/0619* (2013.01);
(Continued)

(58) Field of Classification Search
CPC ............. H01L 29/7397; H01L 27/0635; H01L 29/0696; H01L 29/0646; H01L 29/4238;
(Continued)

(56) References Cited

U.S. PATENT DOCUMENTS 3,704,398 A * 11/1972 Fukino ................ H01L 29/0692
257/579
6,118,150 A * 9/2000 Takahashi ........... H01L 29/0696
257/341
(Continued)

FOREIGN PATENT DOCUMENTS

JP 2001-308327 A 11/2001
JP 2004-039838 A 2/2004
(Continued)

OTHER PUBLICATIONS

Machine translation of JP 2004-363327, translated Sep. 11, 2020 (Year: 2020).*

*Primary Examiner* — Lauren R Bell

(57) ABSTRACT

A semiconductor device is provided, wherein a semiconductor substrate includes: a first trench portion provided from a front surface of the semiconductor substrate to a predetermined depth, and having a longer portion and a shorter portion as seen from above; and a first conductivity-type floating semiconductor region at least partially exposed on the front surface and surrounded by the first trench portion, an interlayer insulating film has openings to electrically connect an emitter electrode and the floating semiconductor region, the openings include: a first opening closest to an outer end of the floating semiconductor region in a direction parallel to the longer portion; and a second opening second closest to the outer end in the direction parallel to the longer portion, and a distance between the first opening and the second opening is shorter than a distance between any adjacent two of the openings other than the first opening.

14 Claims, 17 Drawing Sheets

(51) Int. Cl.
*H01L 29/423* (2006.01)
*H01L 29/417* (2006.01)
*H01L 29/40* (2006.01)

(52) U.S. Cl.
CPC ........ *H01L 29/0696* (2013.01); *H01L 29/404* (2013.01); *H01L 29/407* (2013.01); *H01L 29/417* (2013.01); *H01L 29/41708* (2013.01); *H01L 29/4238* (2013.01)

(58) Field of Classification Search
CPC ............... H01L 29/08; H01L 29/41708; H01L 29/66333–66348; H01L 29/7811; H01L 29/7813; H01L 29/7815
See application file for complete search history.

(56) References Cited

U.S. PATENT DOCUMENTS

| | | | |
|---|---|---|---|
| 7,151,297 B2* | 12/2006 | Wakimoto | H01L 29/0696 257/330 |
| 9,786,771 B2* | 10/2017 | Matsuura | H01L 29/7397 |
| 2001/0054738 A1 | 12/2001 | Momota et al. | |
| 2005/0151187 A1* | 7/2005 | Wakimoto | H01L 29/0696 257/330 |
| 2006/0244104 A1* | 11/2006 | Ozeki | H01L 29/0696 257/587 |
| 2012/0326207 A1* | 12/2012 | Yoshimochi | H01L 21/763 257/139 |
| 2014/0246750 A1* | 9/2014 | Takishita | H01L 21/263 257/493 |
| 2018/0269315 A1* | 9/2018 | Kato | H01L 29/7397 |

FOREIGN PATENT DOCUMENTS

| | | | | |
|---|---|---|---|---|
| JP | 2004363327 A | * | 12/2004 | ........ H01L 29/7397 |
| JP | 2005-175425 A | | 6/2005 | |
| JP | 2007-324539 A | | 12/2007 | |

* cited by examiner

SEMICONDUCTOR DEVICE

The contents of the following Japanese patent application are incorporated herein by reference:
NO. 2017-050462 filed in JP on Mar. 15, 2017.

BACKGROUND

1. Technical Field

The present invention relates to a semiconductor device.

2. Related Art

Semiconductor devices including an insulated gate bipolar transistor (IGBT) are conventionally known, in which openings are provided in an interlayer insulating film provided on a dummy region, and the dummy region and an emitter electrode provided on the interlayer insulating film are connected to each other through the openings (see Patent Documents 1 and 2, for example).
Patent Document 1: Japanese Patent Application Publication No. 2005-175425
Patent Document 2: Japanese Patent Application Publication No. 2007-324539
In a view of the semiconductor substrate as seen from above, the dummy region is surrounded by a gate trench portion, and thus is a rectangular region having long sides in the longitudinal direction of the gate trench portion, for example. An (N+)-type emitter region or a (P+)-type contact region is not provided to a shorter portion positioned at a longitudinal-direction end of the gate trench portion, and therefore carriers generated in association with switching of the IGBT are likely to be accumulated at that portion. It is desired to reduce the carrier density at the shorter portion of the gate trench portion as well.

SUMMARY

A first aspect of the present invention provides a semiconductor device including a semiconductor substrate, an interlayer insulating film provided on the semiconductor substrate, and an emitter electrode provided on the interlayer insulating film. The semiconductor substrate may have a first trench portion and a first conductivity-type dummy semiconductor region. The first trench portion may be provided from a front surface of the semiconductor substrate to a predetermined depth. The first trench portion may have a longer portion and a shorter portion in a view of the semiconductor substrate as seen from above. The dummy semiconductor region may be at least partially exposed on the front surface. The dummy semiconductor region may be surrounded by the first trench portion. The dummy semiconductor region may be of a first conductivity type. The interlayer insulating film may have a plurality of openings. The plurality of openings may electrically connect the emitter electrode and the dummy semiconductor region to each other. The plurality of openings may include a first opening and a second opening. The first opening may be closest to an outer end of the dummy semiconductor region in a direction parallel to the longer portion of the first trench portion. The second opening may be second closest to the outer end of the dummy semiconductor region in the direction parallel to the longer portion of the first trench portion. A distance between the first opening and the second opening may be shorter than a distance between any adjacent two of the plurality of openings other than the first opening.

The distance between the first opening and the second opening may be shorter than a distance between all adjacent two of the plurality of openings other than the first opening.
An opening area of the first opening in the semiconductor substrate may be greater than an opening area of each of the plurality of openings other than the first opening.
In a view of the semiconductor substrate as seen from above, an outer end of the first opening may be parallel to the shorter portion of the first trench portion in correspondence with the shorter portion.
In a view of the semiconductor substrate as seen from above, an outer end of the first opening may extend in a direction orthogonal to the longer portion of the first trench portion.
In a view of the semiconductor substrate as seen from above, each opening of the plurality of openings other than the first opening may have a long side in a direction parallel to the longer portion of the first trench portion.
The semiconductor substrate may further include a first conductivity-type well region. The well region may be provided from the front surface of the semiconductor substrate to a deeper position than the first trench portion, and may be provided extending from an outer side toward an inner side of the first trench portion to a position directly below the first opening.
In a view of the semiconductor substrate as seen from above, the first opening may be provided at a position closer to the shorter portion in a direction parallel to the longer portion of the first trench portion than a second conductivity-type emitter region. The emitter region may be provided between the first trench portion and a second trench portion provided adjacent to the first trench portion.
The dummy semiconductor region may further include a first conductivity-type contact region. The contact region may be provided being exposed on the front surface of the semiconductor substrate in correspondence with positions at which the plurality of openings are provided.
The semiconductor substrate may further include a first conductivity-type collector region, a second conductivity-type field stop layer, and a second conductivity-type drift region. The collector region may be exposed on a back surface of the semiconductor substrate. The field stop layer may be provided on the collector region. The drift region may be provided on the field stop layer. The drift region may contact a bottom portion of the first trench portion. The field stop layer may have one or more peaks of doping concentration in a depth direction. One of the one or more peaks of doping concentration that is closest to the front surface of the semiconductor substrate may be at a distance of 5 μm or more from the back surface of the semiconductor substrate.
A distance between the second opening and a third opening that is closest to the second opening in a direction parallel to the longer portion may be 50 μm or more and 100 μm or less.
The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side in a direction parallel to the depth direction of a semiconductor substrate 10 is referred to as an "upper" side, and the other side is referred to as a "lower" side. One of two principal surfaces of a substrate, a layer or some other member is referred to as an upper surface, and the other surface is referred to as a lower surface. The "upper" and "lower" directions are not limited to the gravitational direction. Also, although an example where a first conductivity type is P-type and a second conductivity type is N-type is shown in each embodiment, the first conductivity type may be N-type and the second conductivity type may be P-type in other embodiments. Note that (P+)-type indicates higher doping concentration than P-type, and P-type indicates higher doping concentration than (P−)-type. Similarly, (N+)-type indicates higher doping concentration than N-type, and N-type indicates higher doping concentration than (N−)-type.

Also, in this specification, X-axis and Y-axis are orthogonal to each other. X-axis and Y-axis are parallel to the front surface of the semiconductor substrate 10. Z-axis is defined as an axis orthogonal to X-axis and Y-axis. In this specification, the Z-axis direction is parallel to the depth direction of the semiconductor substrate 10.

Figure 1A:
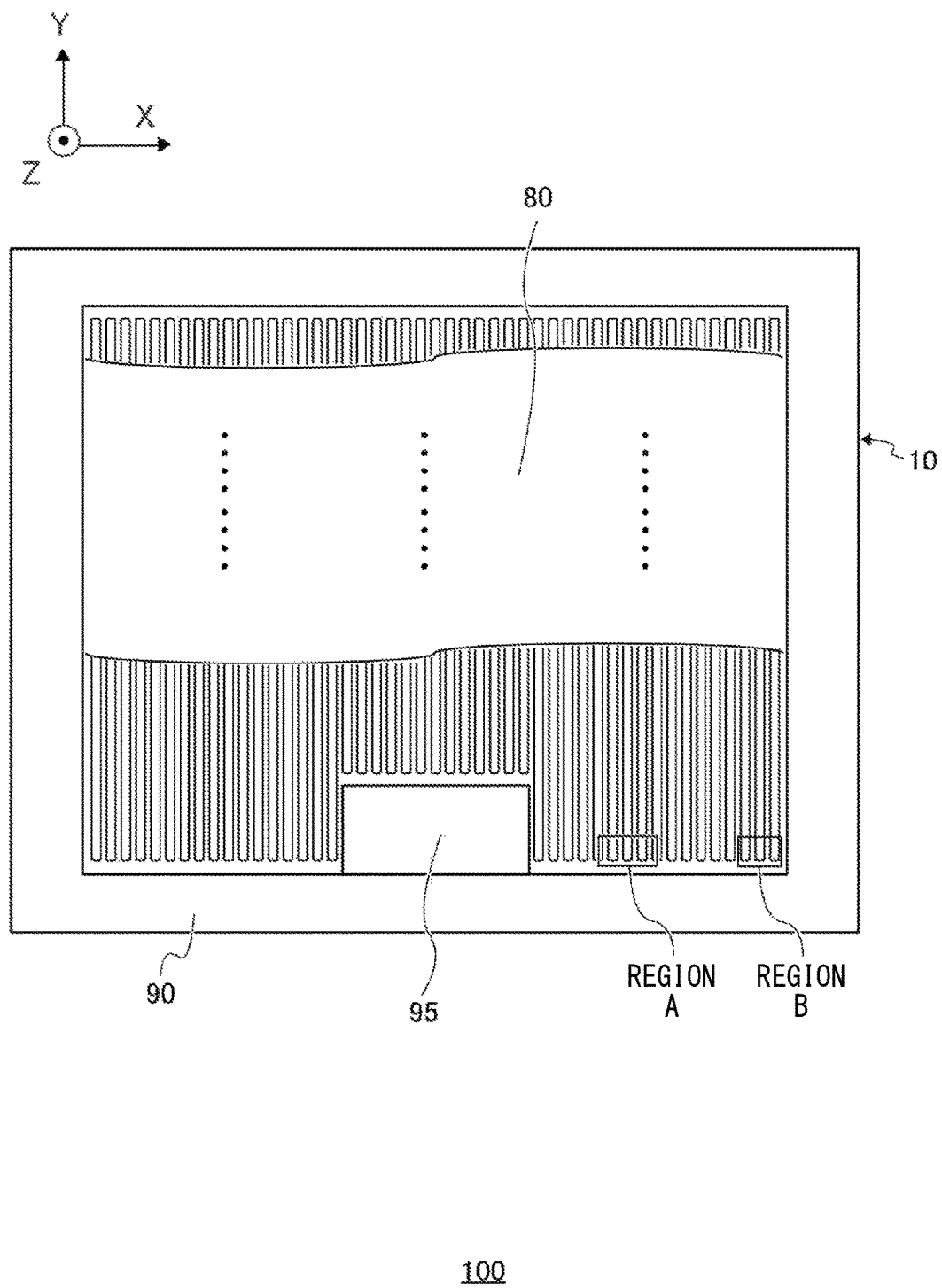
FIG. 1A is a top view of a semiconductor device 100 according to a first embodiment.
Figure 1B:
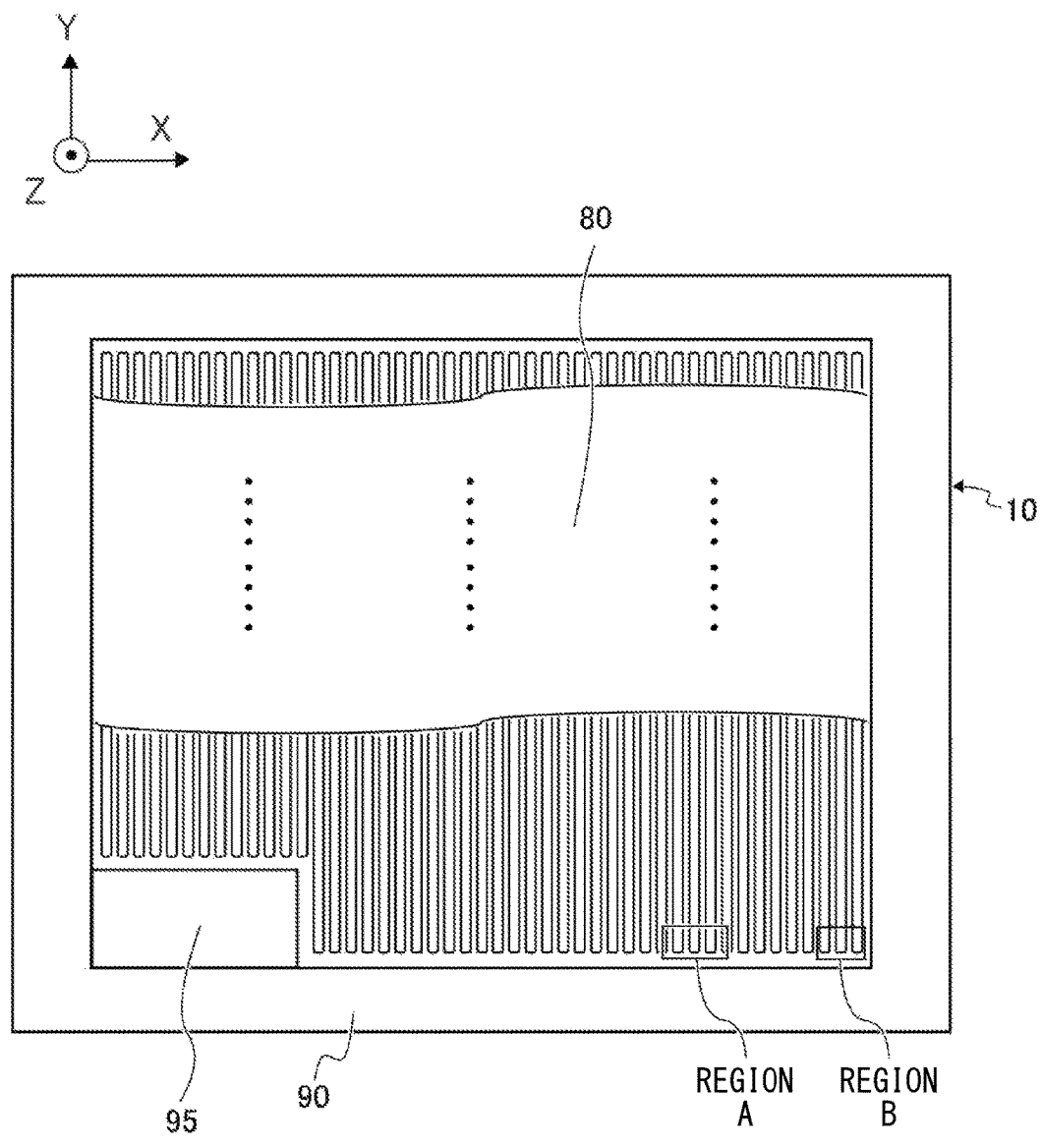
FIG. 1B is a top view of a variation of the semiconductor device 100 according to the first embodiment.

FIG. 1A is a top view of a semiconductor device 100 according to a first embodiment. FIG. 1B is a top view of a variation of the semiconductor device 100 according to the first embodiment. FIG. 1A is also a view of the semiconductor substrate 10 as seen from above. The semiconductor device 100 may be interpreted as a semiconductor chip. The semiconductor device 100 in the present example has a semiconductor substrate 10. The semiconductor device 100 in the present example has an active portion 80, a pad portion 95 and an edge termination structure 90.

The active portion 80 may refer to a region in which current flows in the thickness direction of the semiconductor substrate 10. The active portion 80 in the present example has a transistor region including a transistor such as an IGBT. In the present example, the transistor region refers to a region where a collector region positioned on the back surface side of the semiconductor substrate 10 is projected to the front surface side in a direction perpendicular to the back surface of the semiconductor substrate 10, and the region includes an emitter region (emitter region 12 described later) and a contact region (contact region 16 described later) and includes predetermined unit arrangements that are regularly arranged therein.

The active portion 80 may have a diode region including a diode such as an FWD (Free Wheeling Diode). In the present example, the diode region refers to a region in which a cathode region positioned on the back surface side of the semiconductor substrate 10 is projected to the front surface side in a direction perpendicular to the back surface of the semiconductor substrate 10, or a region on the back surface that coincides with the cathode region.

The semiconductor device 100 in the present example is an IGBT semiconductor chip. However, the semiconductor device 100 may be an RC-IGBT (Reverse Conducting-IGBT) semiconductor chip in which an IGBT and an FWD are provided to a single semiconductor substrate 10.

The edge termination structure 90 in the present example surrounds the active portion 80. The edge termination structure 90 may have a function to mitigate electric field concentration in the vicinity of the front surface of the semiconductor substrate 10. The edge termination structure 90 has a guard ring, a field plate, a RESURF or any combination thereof, for example.

The pad portion 95 may be provided between the active portion 80 and the edge termination structure 90. The pad portion 95 in the present example is provided in a partially indented region of the active portion 80. The pad portion 95 in the present example has a rectangular shape, and its three sides contact the active portion 80 and the other side contacts the edge termination structure 90. The pad portion 95 has, for example, a gate pad to which a gate terminal is electrically connected. The gate terminal may supply a gate potential to the IGBT in the active portion 80. The pad portion 95 may further have one or more electrode pads such as an electrode pad for temperature-sensing and an electrode pad for a sense IGBT. Also, as shown in FIG. 1B, the pad portion 95 may be arranged at a corner of the active portion 80 such that its two sides contact the active portion 80 and the other two sides contact the edge termination structure 90.

Figure 2:
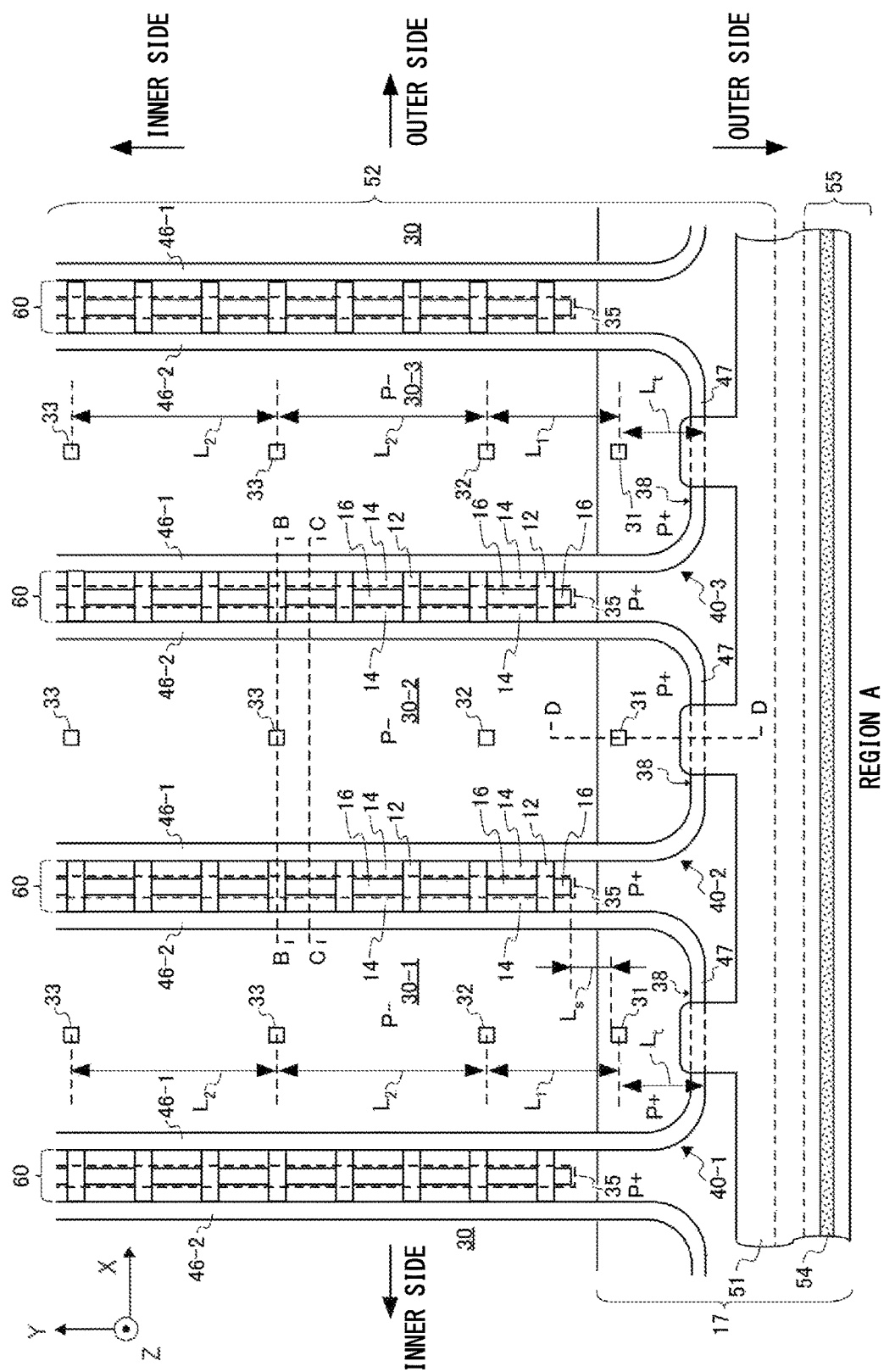
FIG. 2 is an enlarged view of the region A in FIG. 1A and FIG. 1B.

FIG. 2 is an enlarged view of the region A in FIG. 1A and FIG. 1B. The semiconductor device 100 in the present example has an emitter electrode 52 and a gate metal layer 55. The emitter electrode 52 and the gate metal layer 55 may be formed of a metal-containing material. For example, at least a partial region of each electrode is formed of aluminum, an aluminum-silicon alloy, or the like.

An interlayer insulating film is provided between the front surface of the semiconductor substrate 10 and both of the gate metal layer 55 and the emitter electrode 52. However, for the purpose of easy understanding, the interlayer insulating film is not shown in FIG. 2. Note that a plurality of openings are provided in the interlayer insulating film so as to penetrate the interlayer insulating film. The plurality of openings include a first opening 31, a second opening 32, a third opening 33, a fourth opening 35 and an opening 54.

Note that, in this specification, the openings in the interlayer insulating film may be interpreted as contact holes.

The region A in the present example is a region including three trench portions 40 that are adjacent to the edge termination structure 90. In the present example, the three trench portions are respectively referred to as, starting from the innermost one, a first trench portion 40-1, a second trench portion 40-2 and a third trench portion 40-3, for convenience of description. Each trench portion 40 has a trench insulating film, a trench conductive portion and a trench, which will be described later. Each trench portion 40 in the present example is a gate trench portion, and therefore the trench insulating film may be interpreted as a gate insulating film and the trench conductive portion may be interpreted as a gate conductive portion. The width of the trench portion 40 is 1 μm, for example.

The trench portion 40 in the present example has longer portions 46 and shorter portions 47. The trench portion 40 in the present example has a substantially rectangular shape, and its four sides are defined by two longer portions 46 and two shorter portions 47. However, corners of the rectangular shape may be curved to smoothly connect the longer portions 46 and the shorter portions 47.

In the present example, the longer portions 46 include an inner longer portion 46-1 and an outer longer portion 46-2, the shorter portions 47 include an inner shorter portion 47 and an outer shorter portion 47. Note that, in the present example, the word "outer" refers to a position closer to the edge termination structure 90 in the Y-axis direction, and the word "inner" refers to a position closer to the center of the active portion 80 in the Y-axis direction. The Y-axis direction is also a direction parallel to the longer portion 46. Note that, the semiconductor device 100 in the present example may have the same structure as the region A at its end opposite to the region A in the Y-axis direction.

The semiconductor substrate 10 in the present example has, in a mesa region 60, a second conductivity-type emitter region 12, a first conductivity-type base region 14 and a first conductivity-type contact region 16. In the present example, the mesa region 60 refers to a region of the semiconductor substrate 10 that is provided between the longer portion 46-1 of a trench portion 40 and the longer portion 46-2 of a trench portion 40 adjacent to each other and is positioned above the bottom portion of each trench portion 40. Note that the longer portion 46-1 of a trench portion 40 is an example of a first trench portion, and the longer portion 46-2 of a trench portion 40 is an example of a second trench portion.

The shorter portion 47 may be positioned below a gate runner 51. The trench conductive portion in the shorter portion 47 may be electrically connected to the gate runner 51. The opening 54 is provided on a portion of the gate runner 51 positioned on an outer side relative to the trench portion 40 in the Y-axis direction. The gate runner 51 may be electrically connected to the gate metal layer 55 through the opening 54, and a gate potential may be supplied to the trench conductive portion through the gate runner 51.

In the present example, the emitter region 12 is an (N+)-type semiconductor region, the base region 14 is a (P−)-type semiconductor region, and the contact region 16 is a (P+)-type semiconductor region. The emitter region 12 may be formed by selectively ion-implanting N-type impurities into the base region 14, and the contact region 16 may be formed by selectively ion-implanting P-type impurities into the base region 14.

In the present example, (P+)-type well regions 17 are provided at both Y-axis direction ends of the mesa region 60. In the mesa region 60 between two well regions 17, the emitter region 12 and a set of the base region 14 and the contact region 16 may be exposed on the front surface of the semiconductor substrate 10 alternately in the Y-axis direction. However, the base region 14 may be provided at a position contacting the well region 17.

In the mesa region 60, the base region 14 and the contact region 16 may be exposed on the front surface of the semiconductor substrate 10 alternately in the X-axis direction. In the mesa region 60 in the present example, the contact region 16 is positioned between the base region 14 contacting the longer portion 46-1 and the base region 14 contacting the longer portion 46-2 in the X-axis direction.

However, in a region of the mesa region 60 contacting the well region 17, one contact region 16 does not divide the base region into two regions. In this region, one side of the contact region 16 contacts the emitter region 12, and the other three sides of the contact region 16 that are protruding to an outer or inner side relative to the emitter region 12 are surrounded by the base region 14.

In the present example, a fourth opening 35 is provided on the mesa region 60. The range of the fourth opening 35 is indicated by dotted lines. The fourth opening 35 may be provided at a position corresponding to the contact region 16 in the mesa region 60. The fourth opening 35 in the present example is provided continuously from the contact region 16 on the outermost side to the contact region 16 on the innermost side in the mesa region 60, and in parallel with the Y-axis direction. That is, the fourth opening 35 in the present example is also provided on the emitter region 12 sandwiched between two contact regions 16 in the Y-axis direction.

Also, the fourth opening 35 may have a width corresponding to the X-axis direction width of the contact region 16. The fourth opening 35 in the present example has a width that is the same as or smaller than the X-axis direction width of the contact region 16. However, for ease of viewing the figure, the outline of the fourth opening 35 is shown to be outside the perimeter of the contact region 16 in FIG. 2.

A dummy base region 30 may be provided from the front surface of the semiconductor substrate 10 to a predetermined depth. The dummy base region 30 in the present example is, in a view of the semiconductor device 100 as seen from above, a region that is at least partially exposed on the front surface of the semiconductor substrate 10 and is surrounded by the trench portion 40. The dummy base region 30 may have a substantially rectangular shape that is longer in the Y-axis direction than in the X-axis direction. Note that the dummy base region 30 may be, in a cross-sectional view of the semiconductor device 100, a region of the semiconductor substrate 10 that is positioned above the bottom portion of the trench portion 40.

The dummy base region 30 in the present example has an outer end 38 at its negative Y-axis direction end, and has an inner end at its positive Y-axis direction end. Note that the inner end is not shown in FIG. 2, for convenience of drawing. In the present example, the outer end 38 of the dummy base region 30 contacts one shorter portion 47 of the trench portion 40, and the inner end of the dummy base region 30 contacts the other shorter portion 47. An end region including the outer end 38 of the dummy base region 30 and an end region including the inner end of the dummy base region 30 may each be a (P+)-type well region 17. On the other hand, regions of the dummy base region 30 other than the end regions may be (P−)-type semiconductor regions in the same manner as the base region 14. Also, the dummy base region 30 may be at a greater depth than the base region 14.

The dummy base region 30 may not necessarily be electrically insulated from the emitter electrode 52. That is, it is intended that the dummy base region 30 may not be completely electrically floating. The dummy base region 30 in the present example is electrically connected to the emitter electrode 52 through the first opening 31, the second opening 32 and the third opening 33.

The first opening 31, the second opening 32 and the third opening 33 may be arranged in a straight line in the Y-axis direction. In the present example, one first opening 31 and one second opening 32 and a plurality of third openings 33 are provided on the dummy base region 30. The first opening 31 may be closest to the outer end 38 of the dummy base region 30 in the Y-axis direction. In the present example, the first opening 31, the second opening 32 and the third opening 33 are close to the outer end 38 in the Y-axis direction in this order. The first opening 31 may be positioned on the well region 17 in the dummy base region 30, or may be positioned on a region on an inner side relative to the well region 17 (i.e. on a (P−)-type region). The first opening 31 in the present example is positioned on the well region 17.

The second opening 32 may be second closest to the outer end 38 of the dummy base region 30 in the Y-axis direction. The distance between the first opening 31 and the second opening 32 may be shorter than the distance between any adjacent two of the plurality of openings other than the first opening 31. In this manner, extraction of carriers (holes for example) can be improved compared to the case where openings are provided on the dummy base region 30 at regular intervals in the Y-axis direction. Accordingly, the carrier density at the shorter portion 47 of the trench portion 40 can be reduced.

Note that, in the present example, the distance between openings refers to the distance between the respective centers of two openings. However, in other examples, the distance between openings may refer to the shortest distance between adjacent sides of two openings. In the present example, a distance $L_1$ between the first opening 31 and the second opening 32 refers to the distance between the center position of the first opening 31 and the center position of the second opening 32. Also, a distance $L_2$ between the second opening 32 and the third opening 33 refers to the distance between the center position of the second opening 32 and the center position of the third opening 33.

The distance $L_1$ may be 30 µm or more and 60 µm or less. The distance $L_1$ in the present example is 50 µm. Also, the distance $L_2$ may be 50 µm or more and 100 µm or less, or may be 70 µm or more and 80 µm or less. The distance $L_2$ in the present example is 65 µm. In the present example, the distance between two adjacent third openings 33 is equal to the distance $L_2$. Accordingly, in the present example, the distance $L_1$ is shorter than the distance between all adjacent two of the plurality of openings other than the first opening 31. However, the distance $L_1$ is smaller than the distance $L_2$. The distance $L_1$ may be 80% or less, or 50% or less of the distance $L_2$.

The first opening 31 may be provided at a position closer to the shorter portion 47 than the (N+)-type emitter region 12 positioned on the outermost side in the mesa region 60. The Y-axis direction inner end of the first opening 31 may be positioned on an outer side relative to the Y-axis direction outer end of the contact region 16 positioned on the outermost side in the Y-axis direction. In the present example, a distance $L_s$ between the Y-axis direction inner end of the first opening 31 and the Y-axis direction outer end of the contact region 16 positioned on the outermost side in the Y-axis direction is 6 µm.

The distance between the center position of the first opening 31 and the outer end 38 of the dummy base region 30 is referred to as Lt. The distance Lt may be 1 µm or more and 10 µm or less, or may be 2 µm or more and 5 µm or less. By making the first opening 31 closer to the outer end 38, extraction of carriers accumulated in the vicinity of the outer shorter portion 47 can be improved.

The first opening 31, the second opening 32 and the third opening 33 may each have a rectangular shape. In the present example, each of the first opening 31, the second opening 32 and the third opening 33 has a square shape, and the length of each side of the square is 2 µm. However, the shapes of the openings and the lengths of the sides of the openings are not limited only to the shape and the length in the present example.

Note that, in order to improve carrier extraction, at least one of the following means is to be considered with regard to a plurality of openings provided on the dummy base region 30: increasing the number of openings; and narrowing the interval between openings. In this case, however, carriers would be excessively extracted from the dummy base region 30 compared to the present example, and therefore the saturation voltage: $V_{CE}$ (sat) would be increased. Also, in at least one case of decreasing the number of openings and widening the interval between openings compared to the present example, not as many carriers as in the present example would be extracted from the dummy base region 30 and some carriers would remain, and therefore there may be a problem that the surge voltage in $V_{CE}$ at turn-on is increased.

Thus, it is desired to control the carrier extraction to a certain level by arranging openings on the dummy base region 30 at predetermined regular intervals, while facilitating carrier extraction in the vicinity of the Y-axis direction end of the trench portion 40, where carriers are likely to be accumulated, compared to regions other than the end. In order to achieve that, the present example provides an improved arrangement of openings on the dummy base region 30. Note that the number of openings positioned on the dummy base region 30 may be appropriately calculated based on the Y-axis direction length of the longer portion 46 of the trench portion 40 and the interval between openings described above.

Figure 3:
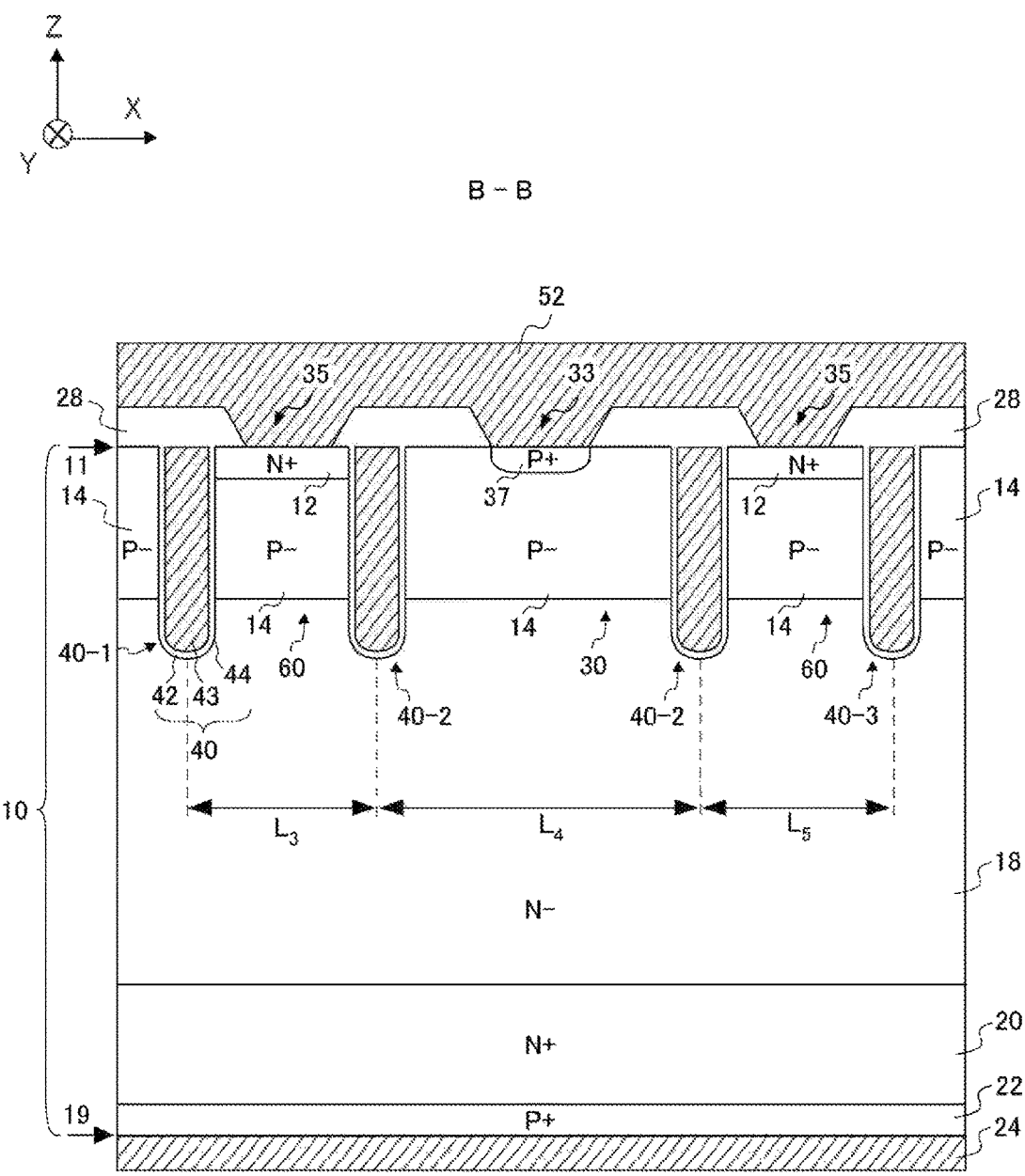
FIG. 3 shows a cross section taken along B-B in FIG. 2.

FIG. 3 shows a cross section taken along B-B in FIG. 2. The cross section taken along B-B is a cross section that is parallel to the X-Z plane and passes through an emitter region 12 and a third opening 33. In FIG. 3, a front surface 11 and a back surface 19 of the semiconductor substrate 10 are shown.

The semiconductor device 100 includes a collector electrode 24, an interlayer insulating film 28 and an emitter electrode 52. The collector electrode 24 may be formed of a conductive material such as metal. At least part of the emitter electrode 52 is provided on the interlayer insulating film 28. The emitter electrode 52 in the present example is provided on the interlayer insulating film 28 and in each opening in the interlayer insulating film 28. However, in other examples, a plug formed of lamination of a barrier metal and tungsten may be provided in each opening in the interlayer insulating film 28. In such other examples, the emitter electrode 52 is provided on the interlayer insulating film 28 and the plug.

The semiconductor substrate 10 includes a collector region 22, a field stop (FS) layer 20, a drift region 18 and a base region 14, in a direction from the back surface 19 toward the front surface 11 (the positive Z-axis direction). The collector region 22 is a first conductivity-type semiconductor region. The collector region 22 in the present example is a (P+)-type semiconductor region. The lower surface of the collector region 22 may be exposed on the back surface 19 of the semiconductor substrate 10. In the present example, the lower surface of the collector region 22 corresponds to the back surface 19 of the semiconductor substrate 10. By reducing the P-type doping concentration of the collector region 22, the carrier density of the drift region 18 in operation of the IGBT can be reduced. The FS layer 20 is provided on the upper surface of the collector region 22.

The FS layer 20 is a second conductivity-type semiconductor layer. The FS layer 20 may be positioned on the collector region 22. The FS layer 20 may have one or more peaks of N-type doping concentration provided discretely in the Z-axis direction. In an example, when protons are ion-implanted through the back surface 19 of the semiconductor substrate 10, the accelerating energy of the ion implantation may be adjusted to adjust the range of protons in the depth direction. One or more peaks of N-type doping concentration may be formed in this manner. The FS layer 20 in the present example is an (N+)-type semiconductor layer.

The drift region 18 is a second conductivity-type semiconductor region. The drift region 18 may be positioned on the FS layer 20. The N-type doping concentration of the drift region 18 is lower than the N-type doping concentration of the FS layer 20. The drift region 18 in the present example is an (N−)-type semiconductor region.

The base region 14 is a first conductivity-type semiconductor region. The base region 14 may be positioned on the drift region 18. The base region 14 in the present example is a (P−)-type semiconductor region.

Trench portions 40 are provided from the front surface 11 of the semiconductor substrate 10 to a predetermined depth. The trench portions 40 in the present example penetrate the base region 14 and reach the drift region 18. The bottom portions of the trench portions 40 contact the drift region 18. Each trench portion 40 has a trench 44, a trench insulating film 42 and a trench conductive portion 43. In each trench portion 40, the trench insulating film 42 may be formed to contact the inner wall of the trench 44, and the trench conductive portion 43 may be formed to contact the inner wall of the trench insulating film 42.

An emitter region 12 is positioned on the base region 14 in the mesa region 60 positioned between the first trench portion 40-1 and the second trench portion 40-2. The emitter region 12 contacts the first trench portion 40-1 and the second trench portion 40-2 in the X-axis direction. The emitter region 12 is electrically connected to the emitter electrode 52 through the fourth opening 35 in the interlayer insulating film 28. Similarly, an emitter region 12 between the second trench portion 40-2 and the third trench portion 40-3 contacts the second trench portion 40-2 and the third trench portion 40-3, and is electrically connected to the emitter electrode 52 through the fourth opening 35.

In the X-axis direction, the distance between two trench portions 40 adjacent across a mesa region 60 may be approximately half the distance between two trench portions 40 adjacent across a dummy base region 30. In the present example, an interval $L_3$ between the center position of the first trench portion 40-1 in the X-axis direction and the center position of the second trench portion 40-2 in the X-axis direction is 1.5 μm or more and 5.0 μm or less (3.0 μm for example). On the other hand, an interval $L_5$ between the center position of the second trench portion 40-2 in the X-axis direction and the center position of the third trench portion 40-3 in the X-axis direction is 3.0 μm, for example. In the present example, an interval $L_4$ between the center positions of the longer portions 46 of the second trench portion 40-2 in the X-axis direction is 2 μm or more and 10 μm or less (6.0 μm for example). Note that the X-axis direction width of the trench portion 40 is 1 μm. It is apparent that, however, these values are provided as an example and may be appropriately altered depending on design of the semiconductor device 100.

In the present example, the dummy base region 30 has a base region 14 and a contact region 37. The contact region 37 is a first conductivity-type semiconductor region. The contact region 37 in the present example is a (P+)-type semiconductor region. The contact region 37 is provided in the base region 14, and may be at least partially exposed on the front surface 11.

In the dummy base region 30, contact regions 37 may be provided corresponding to the positions at which the plurality of openings are provided. In FIG. 3, a contact region 37 is positioned directly below the third opening 33. However, a contact region 37 may be provided directly below each of the first opening 31, the second opening 32 and the third opening 33. In this manner, extraction of carriers from the dummy base region 30 to the emitter electrode 52 can be improved, compared to the case where the contact region 37 is not provided.

Figure 4:
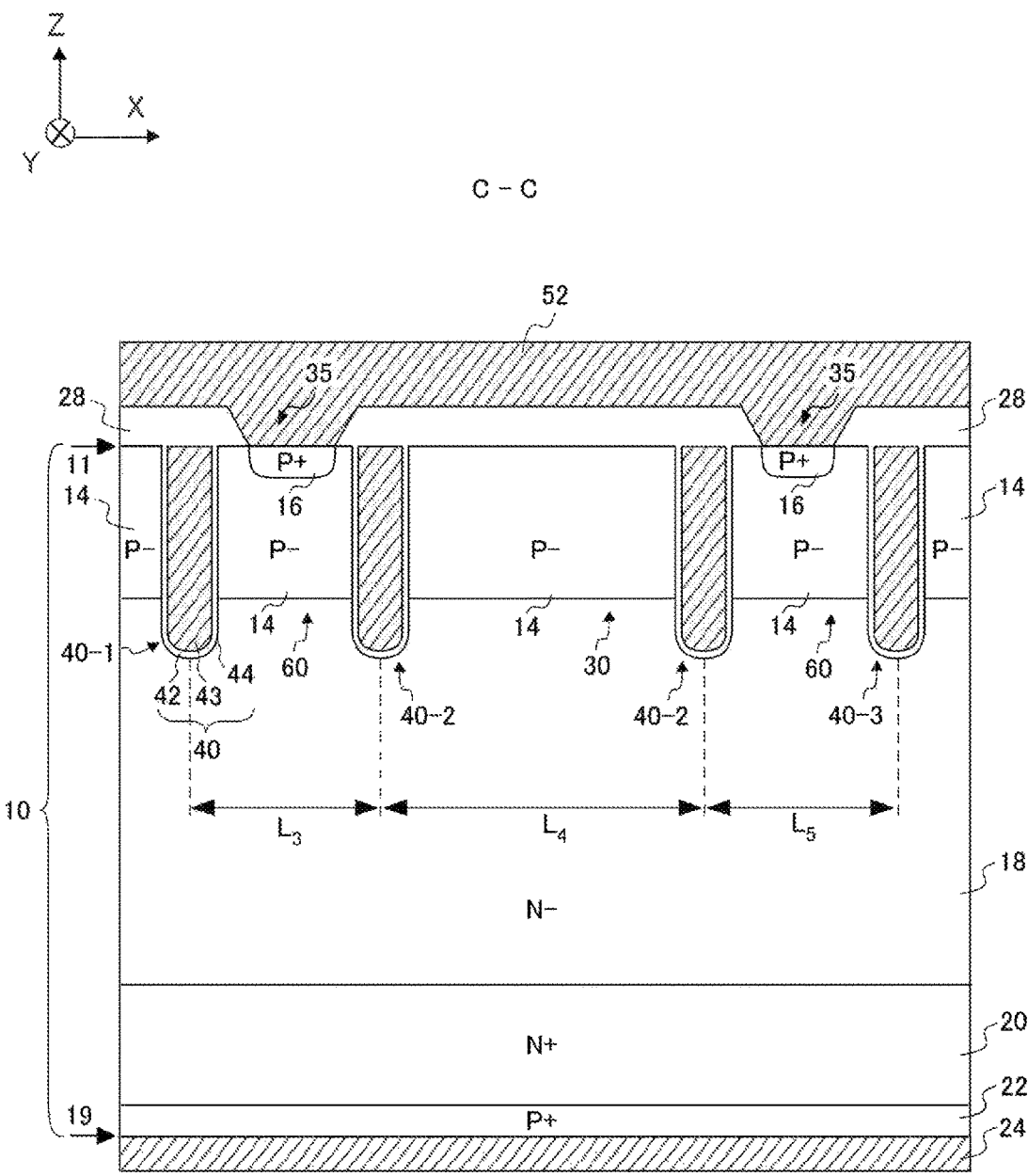
FIG. 4 shows a cross section taken along C-C in FIG. 2.

FIG. 4 shows a cross section taken along C-C in FIG. 2. The cross section taken along C-C is a cross section that is parallel to the X-Z plane and passes through a base region 14 and a contact region 16 in a mesa region 60 but does not pass through an emitter region 12 and a third opening 33. As shown in FIG. 4, the dummy base region 30 in the present example does not have a contact region 37 at the position where an opening is not provided in the interlayer insulating film 28. The dummy base region 30 also does not have a contact region 37 at the position where a first opening 31 or a second opening 32 is not provided.

Figure 5:
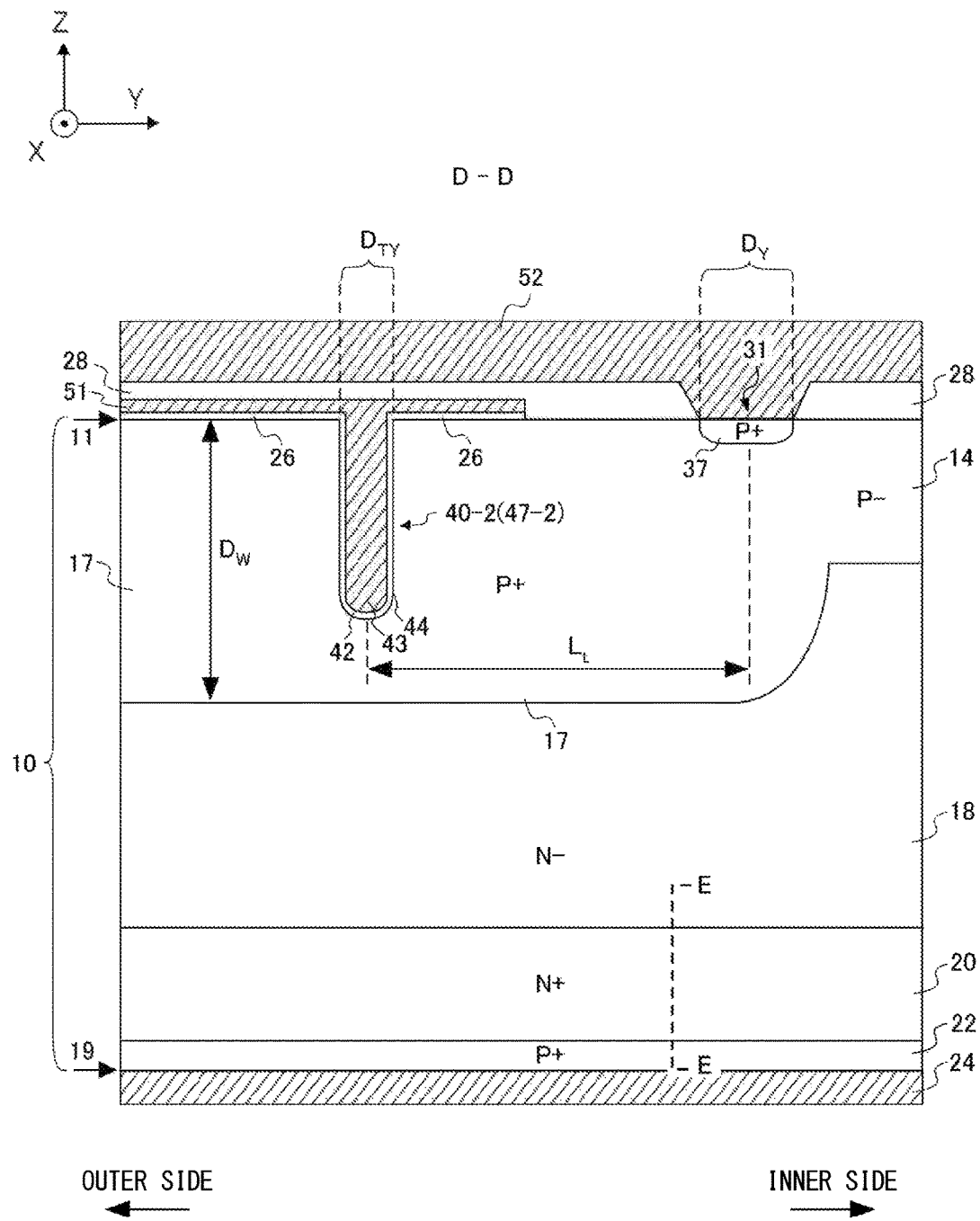
FIG. 5 shows a cross section taken along D-D in FIG. 2.

FIG. 5 shows a cross section taken along D-D in FIG. 2. The cross section taken along D-D is a cross section that is parallel to the Y-Z plane and passes through a first opening 31, a dummy base region 30 and the outer shorter portion 47 of the second trench portion 40-2. In the present example, a width $D_{TY}$ of the trench portion 40 in the Y-axis direction is 1 and a width $D_Y$ of the first opening 31 in the Y-axis direction is 2 However, the width $D_{TY}$ of the trench portion 40 and the width $D_Y$ of the first opening 31 are not limited only to the lengths in the present example.

An oxide film 26 is provided between the gate runner 51 and the front surface 11. The oxide film 26 is, for example, a thermally oxidized silicon film. The oxide film 26 may electrically separate the gate runner 51 and the front surface 11 from each other. However, the oxide film 26 has an opening at the top of the trench portion 40. The gate runner 51 and the trench conductive portion 43 may be electrically connected to each other through the opening.

The well region 17 in the present example is provided from the front surface 11 to a deeper position than the trench portion 40. The bottom portion of the well region 17 is at a lower position than the bottom portion of the trench portion 40. The well region 17 in the present example is at a depth $D_W$ of 8 μm from the front surface 11. A channel may not be formed in the vicinity of the trench portion 40 positioned in the well region 17 (i.e. the shorter portion 47). That is, it may be regarded that collector current (Ic) does not flow in the vicinity of the trench portion 40 covered by the well region 17 at its bottom portion (i.e. the shorter portion 47).

The well region 17 may be provided extending from an outer side toward an inner side relative to the trench portion 40 to a position directly below the first opening 31. In the present example, the inner end of the contact region 37 in the dummy base region 30 is provided on an outer side relative to the inner end of the well region 17 in the Y-axis direction. That is, the well region 17 is present directly below the contact region 37.

If the contact region 37 is not present directly above the well region 17, carriers directly below the trench portion 40 may remain accumulated in the well region 17. That is, carriers directly below the trench portion 40 may continue to be accumulated in the well region 17. On the other hand, in the present example, the well region 17 is provided directly below the contact region 37, and therefore carriers directly below the trench portion 40 in addition to carriers directly below the contact region 37 can be extracted to the emitter electrode 52 through the contact region 37. In this manner, the carrier density in the vicinity of the shorter portion 47 of the trench portion 40 can be reduced. Also, in the present example, the carrier density in the drift region 18 below the edge termination structure 90 is reduced in association with the reduced carrier density in the vicinity of the shorter portion 47 of the trench portion 40.

Figure 6:
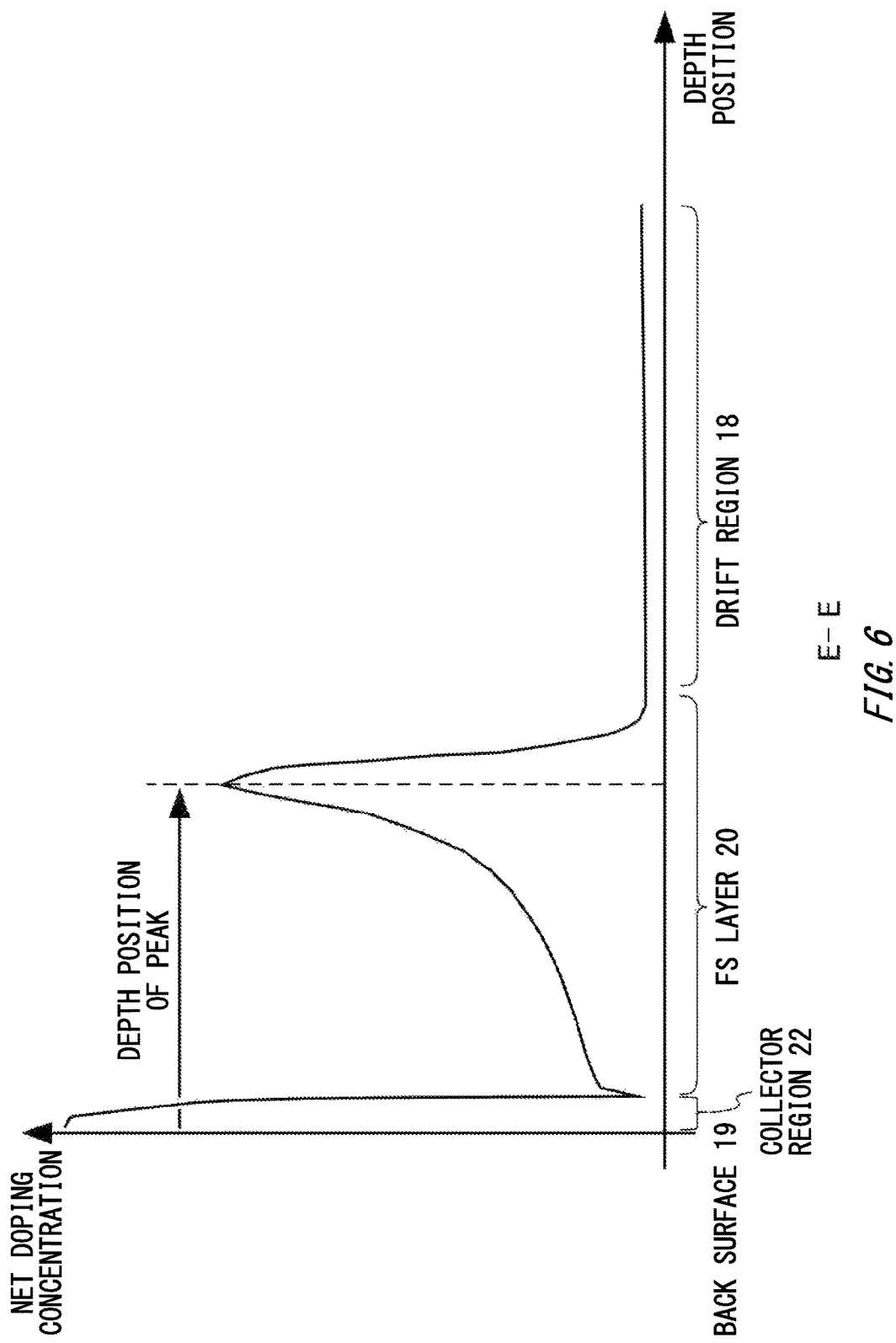
FIG. 6 shows the n-type net doping concentration distribution along E-E in FIG. 5.

FIG. 6 shows the n-type doping concentration distribution along E-E in FIG. 5. The line E-E passes through the collector region 22, the FS layer 20 and the drift region 18 in a direction parallel to the Z-axis direction. The vertical axis indicates net doping concentration, and the horizontal axis indicates depth position from the back surface 19 toward the front surface 11. Note that the depth position of the back surface 19 is set to zero in FIG. 6.

The FS layer 20 may have one or more peaks of doping concentration in the depth direction. The FS layer 20 in the present example has a single peak of doping concentration. However, in other examples, the FS layer 20 may have two or more peaks of doping concentration.

One of the one or more peaks of doping concentration that is closest to the front surface 11 may be at a distance of 5 µm or more from the back surface 19. Note that the peak closest to the front surface 11 may be at a distance of 6 µm or more, or may be at a distance of 8 µm or more. In the present example, the single peak of doping concentration is at a distance of 5 µm or more. In other examples where the FS layer 20 has two or more peaks of doping concentration, the peak closest to the front surface 11 may be at a distance of 5 µm or more.

In the present example, carriers (holes in the present example) are more likely to remain between the peak closest to the front surface 11 in the FS layer 20 and the back surface 19, compared to the case where the peak closest to the front surface 11 is at a position of less than 5 µm. Accordingly, tail current (i) that flows in the semiconductor device 100 at turn-off has a gentle slope. In this manner, di/dt and surge voltage in $V_{CE}$ are reduced.

Note that, reducing di/dt and surge voltage in $V_{CE}$ at turn-off is also associated with arrangement of openings on the dummy base region 30. As described above, the carrier density in the dummy base region 30 at turn-on is reduced by setting the distance $L_2$ to 100 µM or less. In this manner, the depletion layer expands more easily at turn-off compared to the case where the carrier density is not as reduced as in the present example, and therefore the time until the depletion layer reaches the FS layer 20 is shortened.

Also, when the depletion layer reaches the (N+)-type FS layer 20, it becomes difficult to expand any more. Accordingly, the depletion layer does not reach the region between the back surface 19 and the peak closest to the front surface 11. Carriers remaining between the back surface 19 and the peak closest to the front surface 11 are not extracted by the depletion layer but extracted only by the electron-hole recombination, and therefore it takes time for extraction. In this manner, di/dt and surge voltage in $V_{CE}$ are reduced.

Figure 7:
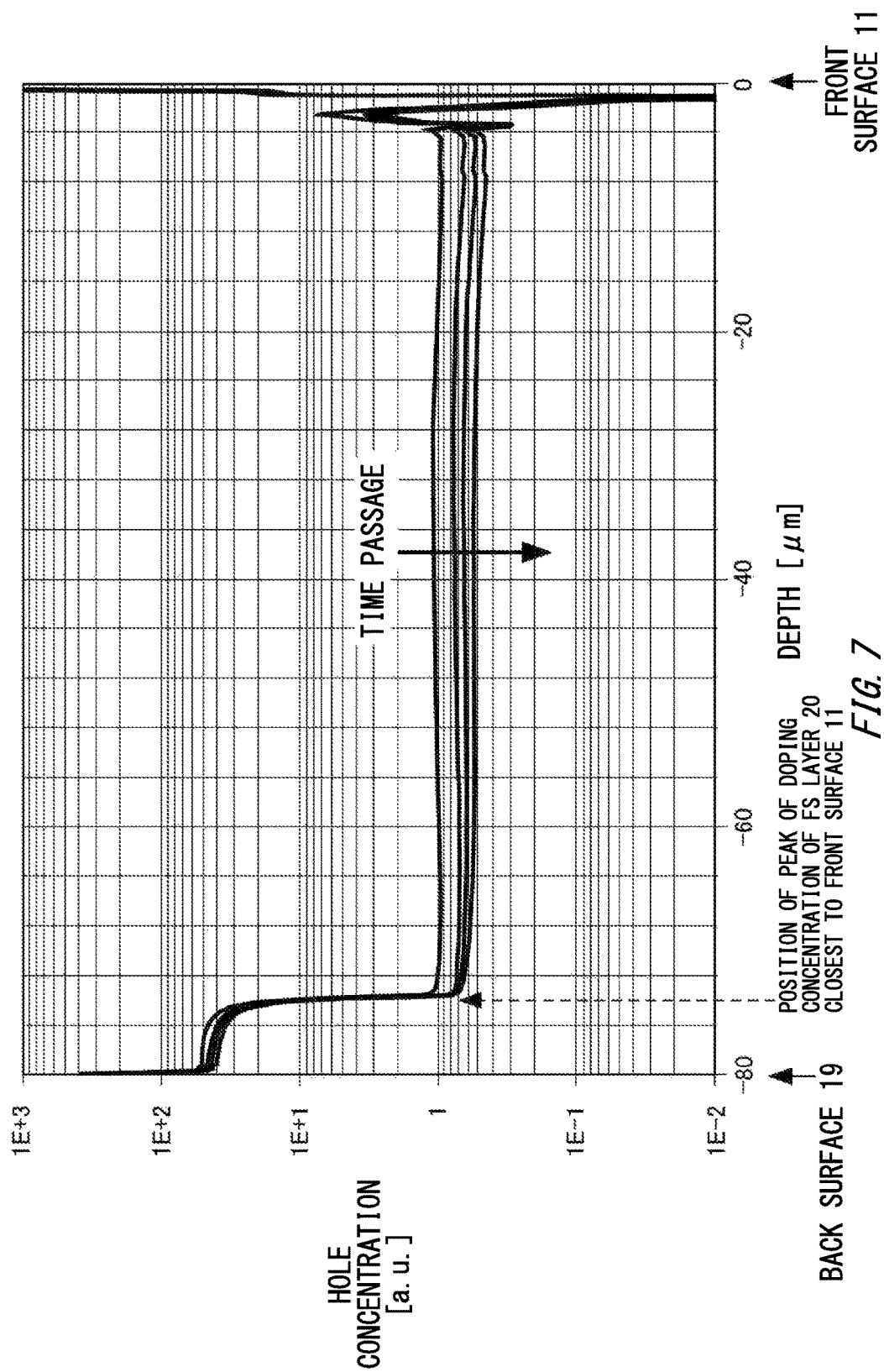
FIG. 7 is a simulation result of changes in hole concentration over time.

FIG. 7 is a simulation result of changes in hole concentration over time. Particularly, FIG. 7 shows the hole concentration between the emitter region 12 and the collector region 22 along a straight line that is parallel to the Z-axis direction and passes through the emitter region 12. The vertical axis indicates hole concentration normalized by $1.0 \times 10^{14}$ (/cm$^3$), and the horizontal axis indicates depth [µm]. Note that the value −80 [µm] corresponds to the back surface 19, and the value 0 [µm] corresponds to the front surface 11. In the present example, the peak of doping concentration closest to the front surface 11 is provided at the position of −74 [µm] (i.e. 6.0 [µm] from the back surface 19). A plurality of lines each indicate a state after a time elapses from the time of turn-off (the solid line). As shown in FIG. 7, the hole concentration decreases to approximately half in the drift region 18. On the other hand, the degree of decrease in the hole concentration in the FS layer 20 is significantly small compared to the drift region 18.

Figure 8:
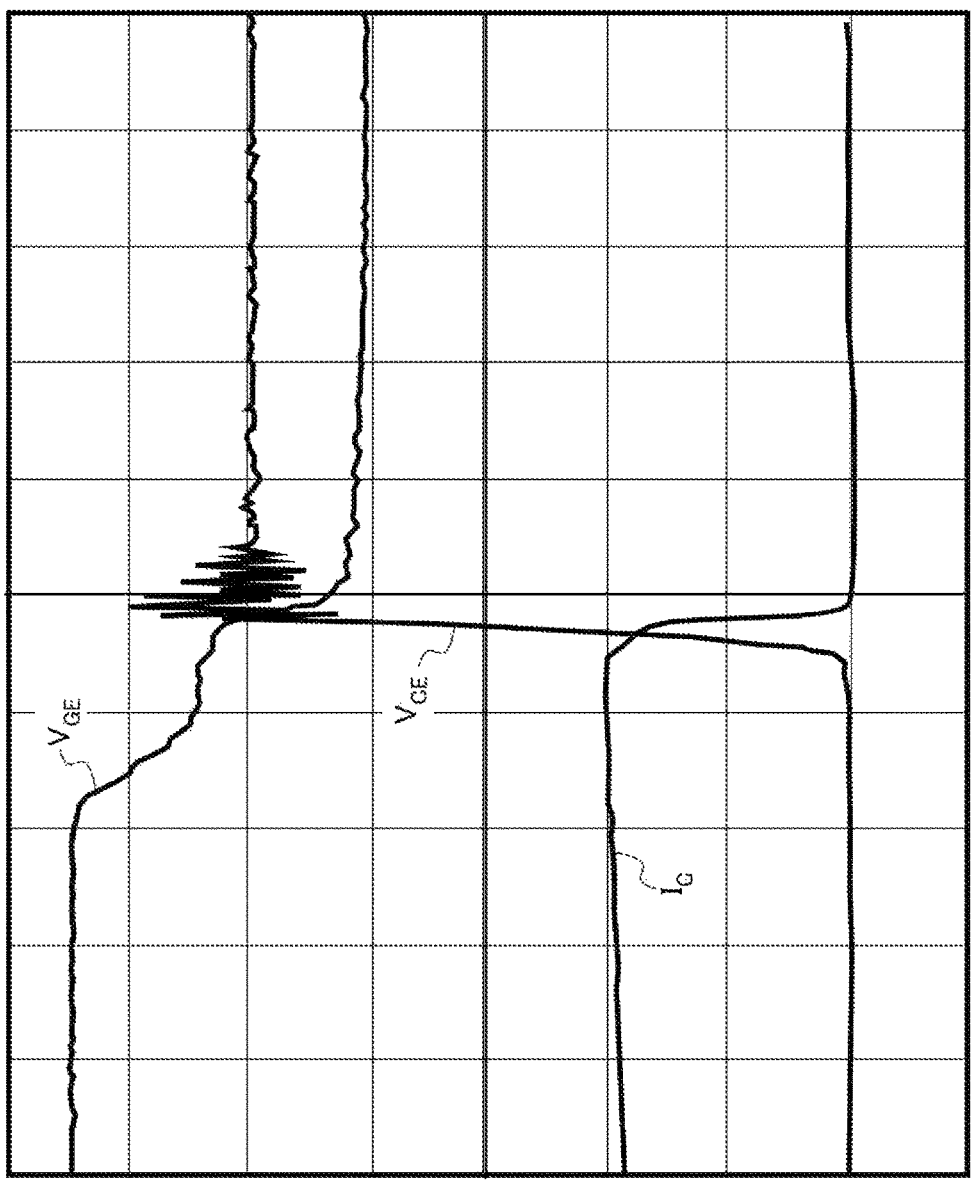
FIG. 8 is a simulation result of $V_{GE}$, $V_{CE}$ and $I_C$ at a low-current turn-off.

FIG. 8 is a simulation result of $V_{GE}$, $V_{CE}$ and $I_c$ at a low-current turn-off. The horizontal axis indicates time. The scale span of the horizontal axis is 200 ns. The vertical axis indicates gate-emitter voltage $V_{GE}$, collector-emitter voltage $V_{CE}$ and collector current $I_C$. The low-current turn-off refers to a turn-off in the case where the collector current $I_C$ is relatively small. In the present example, the collector current $I_C$ is 10 [A].

In the present example, di/dt was able to be increased by reducing the carrier density due to the arrangement of openings on the dummy base region 30 as described above and by reducing the P-type doping concentration of the collector region 22. $I_C$ reached zero quickly compared to the case of a high-current turn-off described later. However, the surge voltage in $V_{CE}$ increases as a result of increasing di/dt. However, the turn-off loss Eoff represented as the product of $V_{CE}$ and $I_C$ can be reduced, and it is particularly advantageous for the semiconductor device 100 which repeatedly performs a low-current turn-on and a low-current turn-off, in that Eoff can be reduced.

Figure 9:
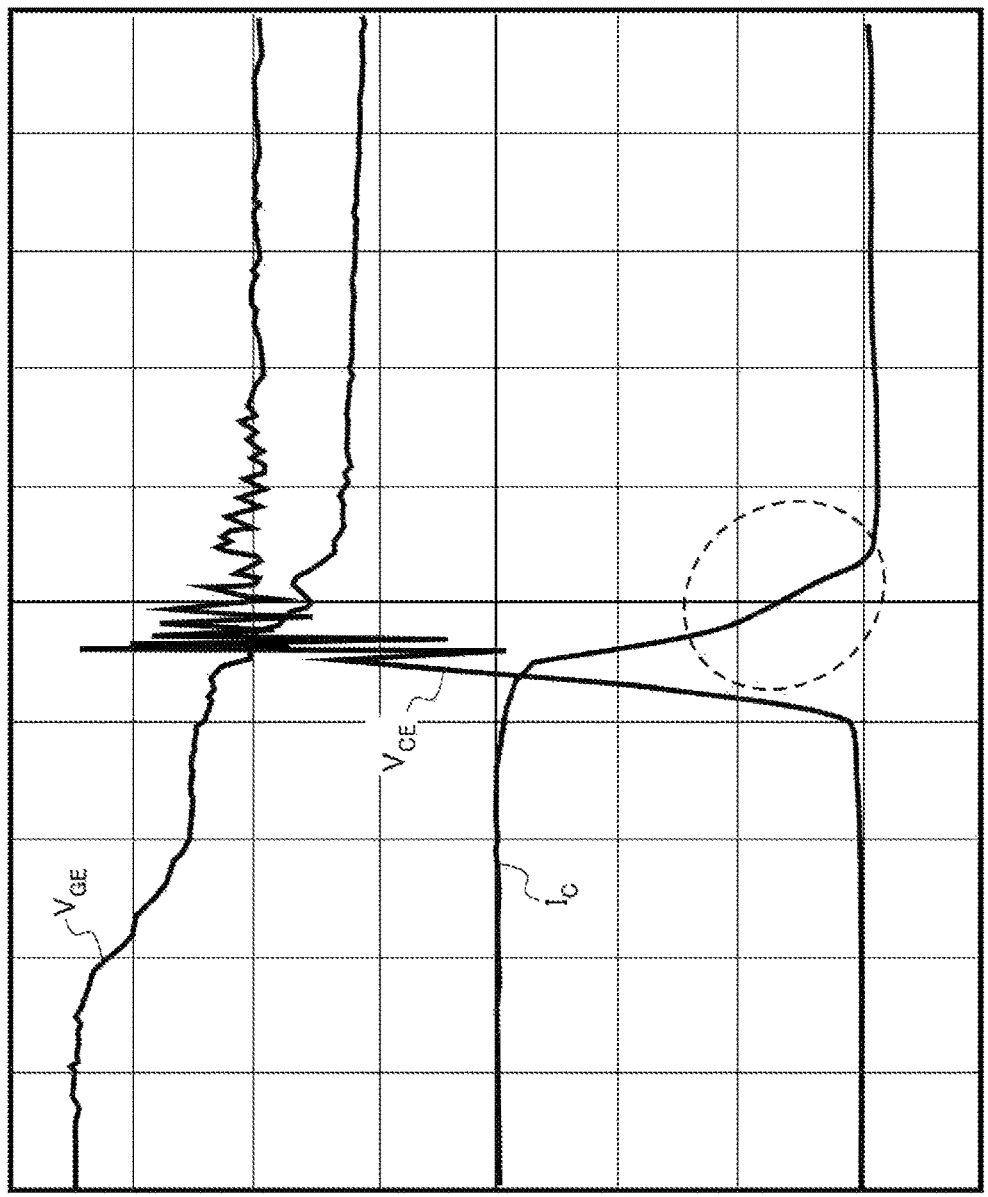
FIG. 9 is a simulation result of $V_{GE}$, $V_{CE}$ and $I_C$ at a high-current turn-off.

FIG. 9 is a simulation result of $V_{GE}$, $V_{CE}$ and $I_C$ at a high-current turn-off. The horizontal axis indicates time, and the scale span of the horizontal axis is 100 ns. The scale of the vertical axis is the same as in FIG. 8. The high-current turn-off refers to a turn-off in the case where the collector current $I_C$ is relatively large. In the present example, the collector current $I_C$ is approximately 30 [A].

The high current of the collector current $I_C$ has a greater value than the low current, and therefore it is concerned that di/dt and the surge voltage in $V_{CE}$ are increased. However, in the present example, di/dt in the region indicated by the circle of broken line and the surge voltage in $V_{CE}$ were able to be reduced. The high-current turn-off is particularly advantageous in that the surge voltage can be reduced.

Figure 10:
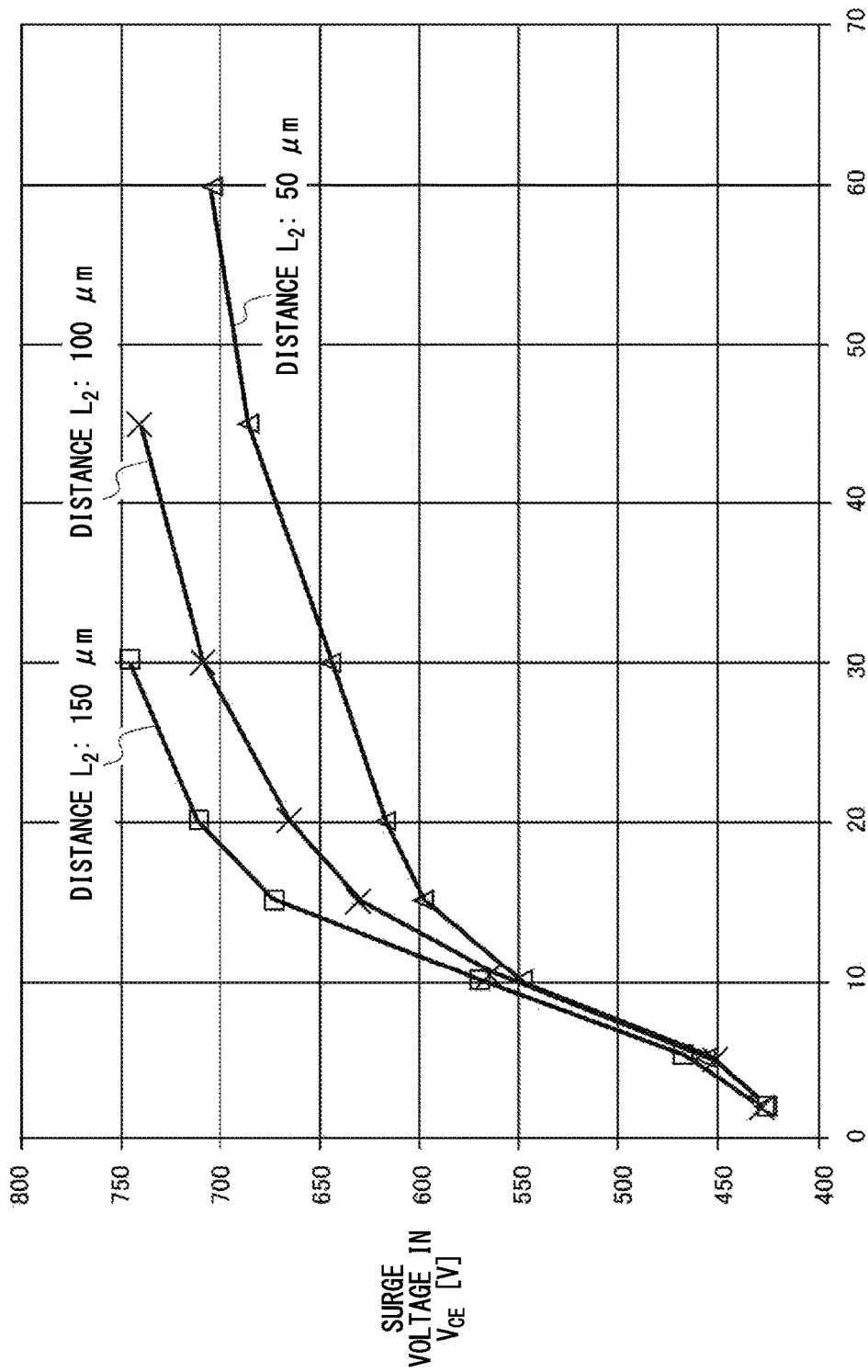
FIG. 10 is a simulation result showing relations between $I_C$ and surge voltage in $V_{CE}$ for respective values of a distance $L_2$.

FIG. 10 is a simulation result showing relations between $I_c$ and the surge voltage in $V_{CE}$ for respective values of the distance $L_2$. The horizontal axis indicates collector current $I_c$ [A], the vertical axis indicates surge voltage [V] in $V_{CE}$. The surge voltage is inclined to increase as the collector current $I_c$ increases. However, the surge voltage was able to be reduced as the distance $L_2$ is smaller on condition that the collector current $I_c$ is the same. Note that the effect of reducing the surge voltage increases as the collector current $I_c$ increases.

Figure 11:
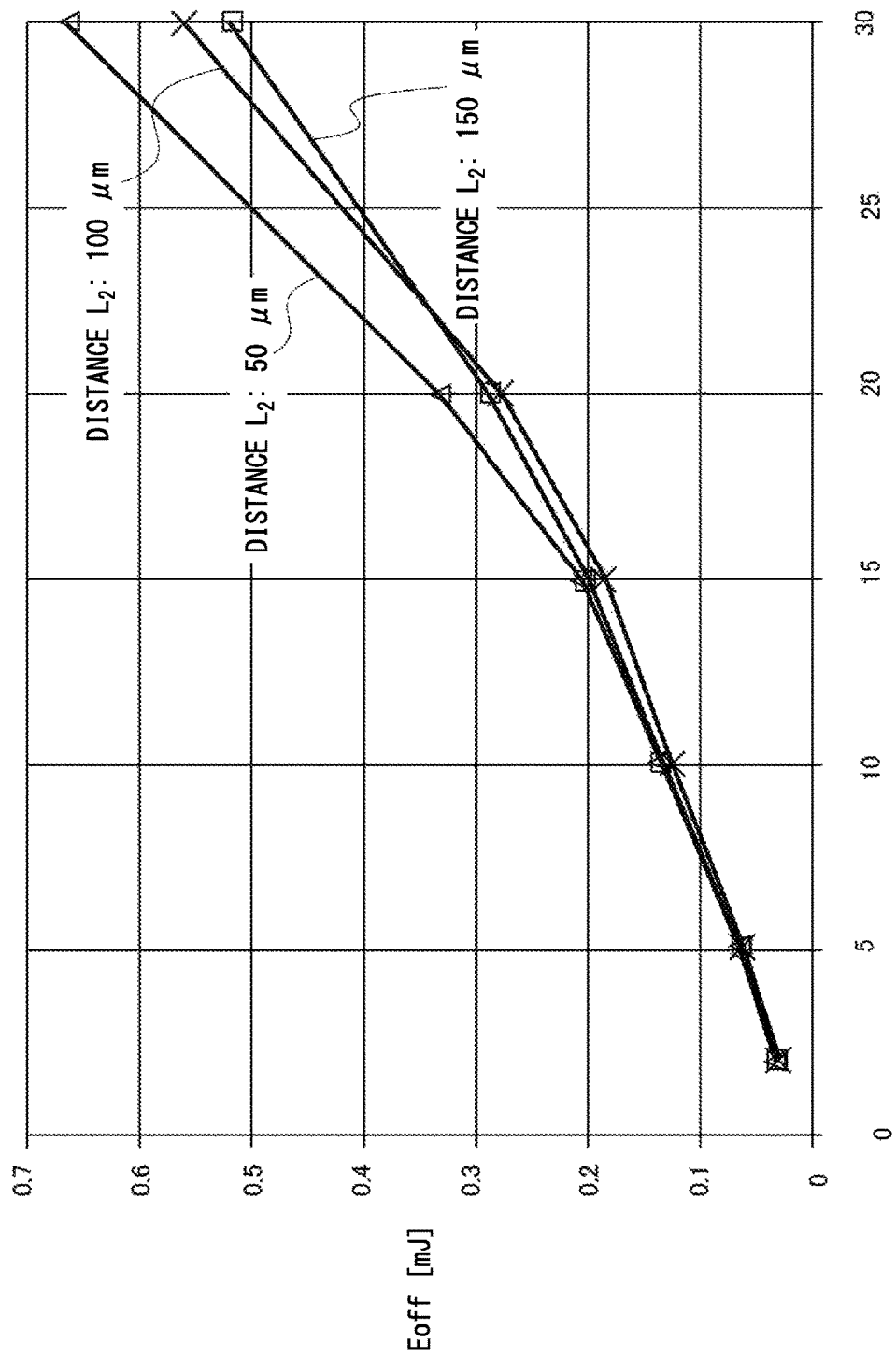
FIG. 11 is a simulation result showing relations between $I_c$ and Eoff for respective values of the distance $L_2$.

FIG. 11 is a simulation result showing relations between $I_c$ and Eoff for respective values of the distance $L_2$. When $I_c$ is 15 A or less, Eoff can be reduced more significantly compared to when $I_c$ is larger than 15 A. That is, Eoff can be reduced in the case of the low-current turn-off. Note that, as described above, the distance $L_2$ in the present example is 50 μm or more and 100 μm or less.

Figure 12:
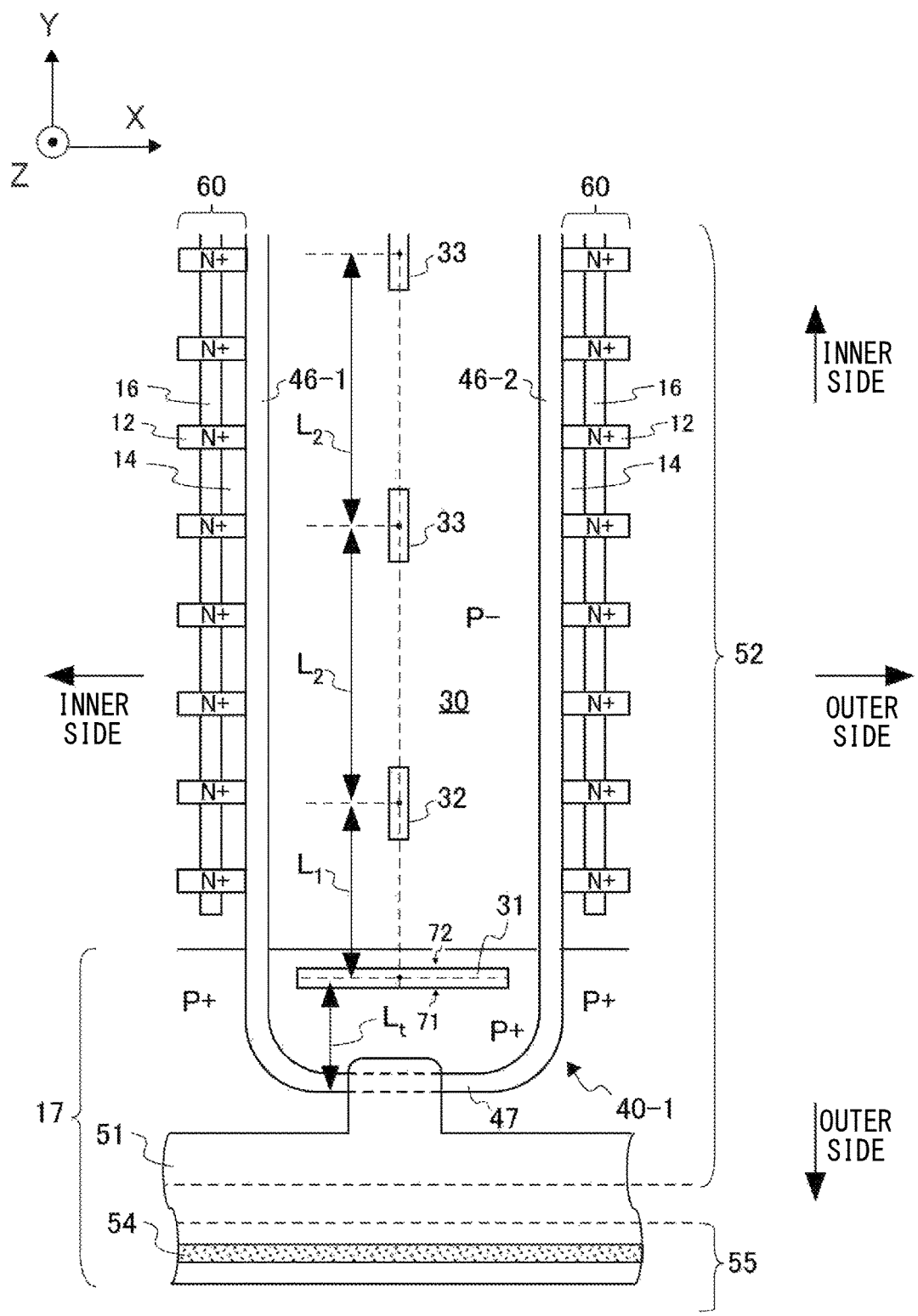
FIG. 12 is a top view showing the vicinity of an outer end of a trench portion 40 according to a second embodiment.

FIG. 12 is a top view showing the vicinity of an end of a trench portion 40 according to a second embodiment. Note that the top view may be interpreted as a view of the semiconductor substrate 10 as seen from above (a view of the front surface 11 of the semiconductor substrate 10). FIG. 12 shows an enlarged view of the first trench portion 40-1, and other trench portions 40 may have the same structure.

In the present example, the opening area of the first opening 31 is greater than the opening area of each opening on the dummy base region 30 other than the first opening 31. By setting the opening area of the first opening 31 to be the largest of the openings on the dummy base region 30, the carrier density in the vicinity of the shorter portion 47 of the trench portion 40 can be further reduced compared to the first embodiment. Note that the opening area may be the area of an opening in the interlayer insulating film 28 measured on the front surface 11 of the semiconductor substrate 10, or may be the area of an opening measured on the upper surface of the interlayer insulating film 28. The opening area in the present example is the area of an opening in the interlayer insulating film 28 measured on the front surface 11.

An outer end 71 and an inner end 72 of the first opening 31 in the Y-axis direction may extend in parallel with the X-axis direction orthogonal to the longer portion 46 of the first trench portion 40-1. Also, the outer end 71 and the inner end 72 of the first opening 31 may be parallel to the shorter portion 47 of the first trench portion 40-1 in correspondence with the shorter portion 47. The first opening 31 in the present example has a rectangular shape having long sides parallel to the X-axis direction and short sides parallel to the Y-axis direction. In this manner, the opening area of the first opening 31 can be increased compared to the first embodiment while preventing the first opening 31 from being arranged below the gate runner 51.

Openings of the plurality of openings other than the first opening 31 may have long sides in the Y-axis direction parallel to the longer portion 46-1 of the first trench portion 40-1. The second opening 32 and the third opening 33 in the present example have a rectangular shape having long sides parallel to the Y-axis direction and short sides parallel to the X-axis direction. In this manner, the opening areas of the second opening 32 and the third opening 33 can be increased compared to the first embodiment. Note that, in other examples, only the first opening 31 may have the shape in the present embodiment and the second opening 32 and the third opening 33 may have the same shapes as in the first embodiment.

Figure 13:
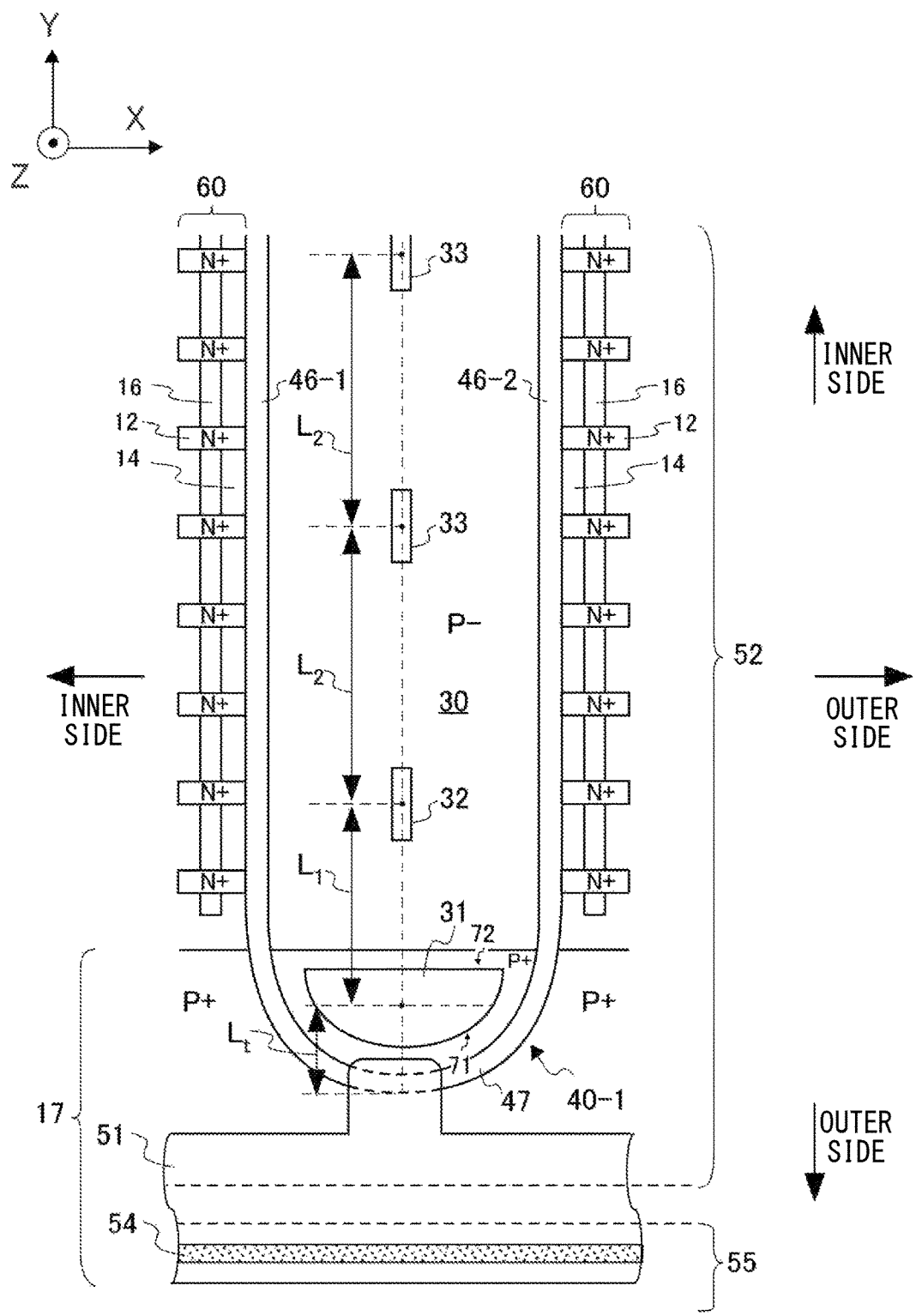
FIG. 13 is a top view showing the vicinity of an outer end of a trench portion 40 according to a third embodiment.

FIG. 13 is a top view showing the vicinity of an end of a trench portion 40 according to a third embodiment. In the present example as well, the opening area of the first opening 31 is greater than the opening area of each opening on the dummy base region 30 other than the first opening 31. FIG. 13 shows an enlarged view of the first trench portion 40-1, and other trench portions 40 may have the same structure. The shorter portion 47 of the trench portion 40 in the present example has a curved shape (more specifically a semicircular arc shape). Also, in the present example, the outer end 71 of the first opening 31 in the Y-axis direction is parallel to the shorter portion 47 of the first trench portion 40-1 in correspondence with the shorter portion 47. That is, the outer end 71 of the first opening 31 is a semicircle that is similar to the arc shape of the shorter portion 47. Note that the first opening 31 in the present example has a semicircular disk shape formed of a semicircle of the outer end 71 and a straight line of the inner end 72. In the present example as well, the opening area of the first opening 31 can be increased compared to the first embodiment while preventing the first opening 31 from being arranged below the gate runner 51. Note that, while the second opening 32 and the third opening 33 in the present example have the same shapes as in the second embodiment, in other examples only the first opening 31 may have the shape in the present embodiment and the second opening 32 and the third opening 33 may have the same shapes as in the first embodiment.

Figure 14:
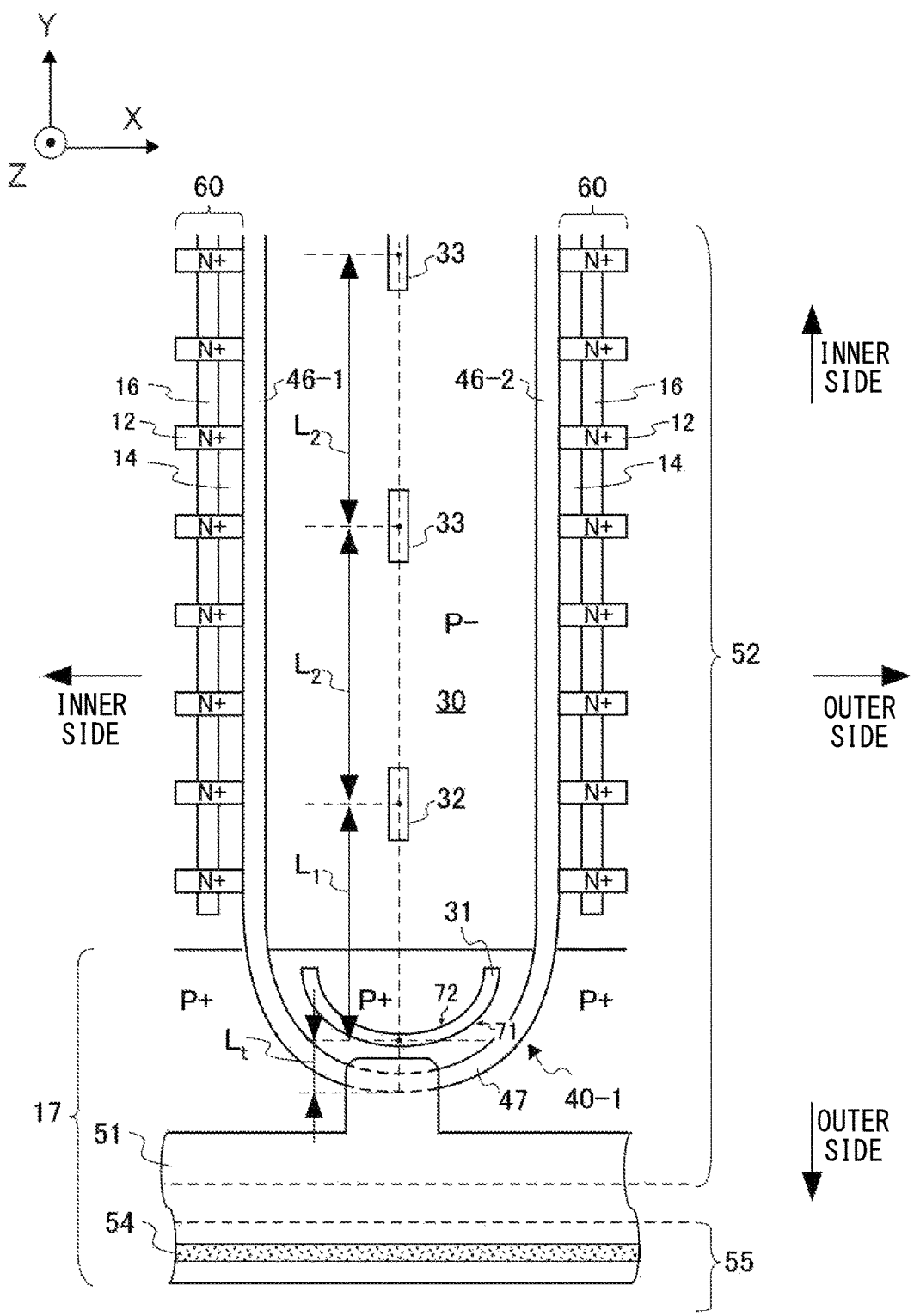
FIG. 14 is a top view showing the vicinity of an outer end of a trench portion 40 according to a fourth embodiment.

FIG. 14 is a top view showing the vicinity of an end of a trench portion 40 according to a fourth embodiment. In the present example as well, the opening area of the first opening 31 is greater than the opening area of each opening on the dummy base region 30 other than the first opening 31. FIG. 14 shows an enlarged view of the first trench portion 40-1, and other trench portions 40 may have the same structure. In the present example, the outer end 71 and the inner end 72 of the first opening 31 are parallel to the shorter portion 47 of the first trench portion 40-1 in correspondence with the shorter portion 47. That is, the first opening 31 in the present example has a semicircular band shape. Also, in the present example, the outer end 71 of the first opening 31 in the Y-axis direction is parallel to the shorter portion 47 of the first trench portion 40-1 in correspondence with the shorter portion 47. The opening area of the first opening 31 may also be increased compared to the first embodiment in this manner. Note that, while the second opening 32 and the third opening 33 in the present example have the same shapes as in the second embodiment, in other examples only the first opening 31 may have the shape in the present embodiment and the second opening 32 and the third opening 33 may have the same shapes as in the first embodiment.

Figure 15:
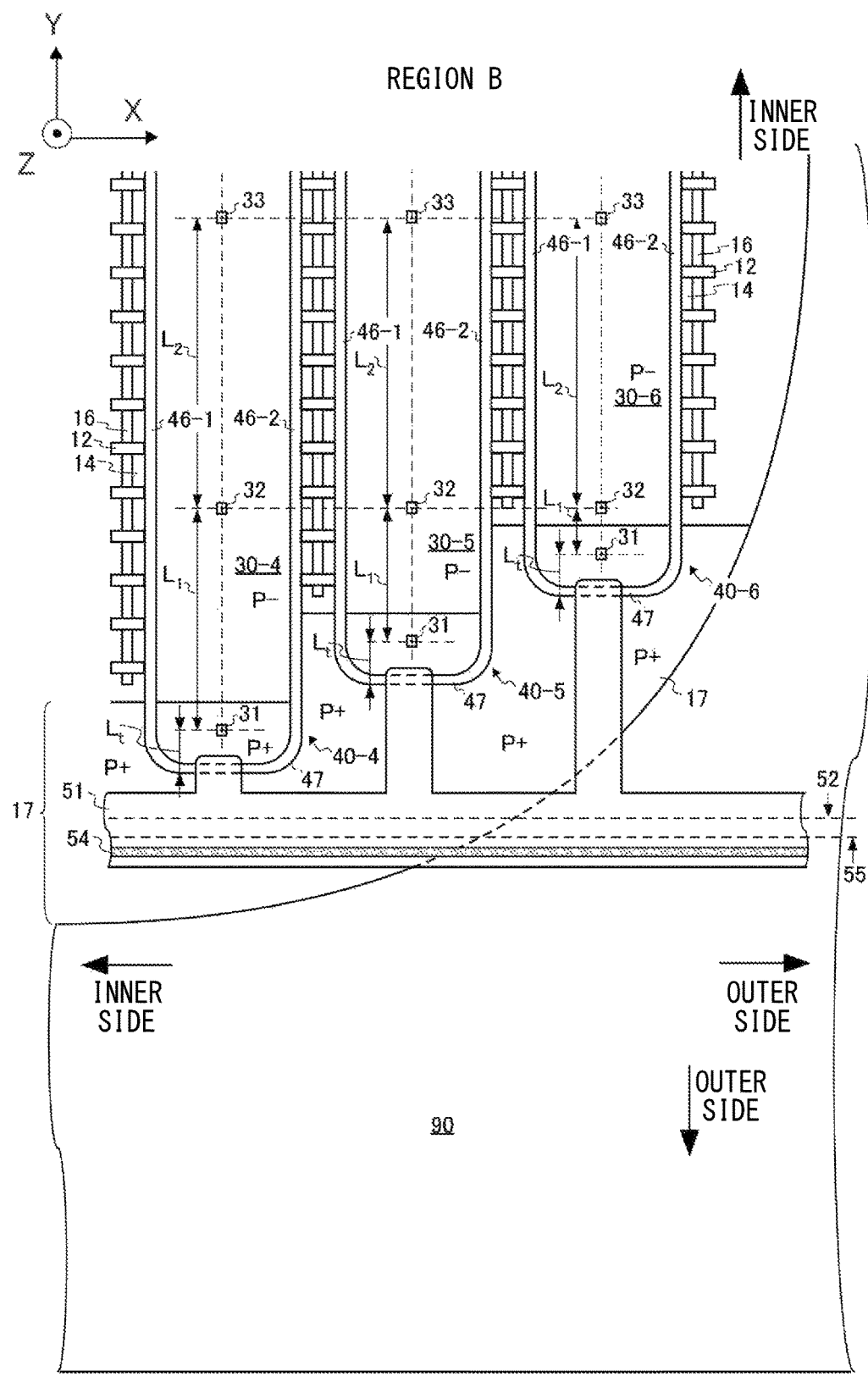
FIG. 15 is a variation of the region B in FIG. 1A and FIG. 1B.

FIG. 15 is a variation of the region B in FIG. 1A and FIG. 1B. The region B is a region at a corner of the active portion 80. In the present example, a fourth trench portion 40-4, a fifth trench portion 40-5 and a sixth trench portion 40-6 are arranged in this order toward an inner side in the X-axis direction. The fourth trench portion 40-4 has the same shape as any of the first to third trench portions 40-1 to 40-3 described above. At a corner of the active portion 80, longer portions 46 of trench portions 40 may have different lengths. In the present example, the longer portions 46 of the sixth trench portion 40-6 have the smallest length, the longer portions 46 of the fifth trench portion 40-5 have the second smallest length, and the longer portions 46 of the fourth trench portion 40-4 have the greatest length. The longer portions 46 of the fourth trench portion 40-4 may have the same length as those of the first trench portion 40-1.

At a corner of the active portion 80, the positions of first openings 31 may be different according to the positions of the trench portions 40. At a corner of the active portion 80, a first opening 31 positioned on a further outer side in the X-axis direction may be positioned on a further inner side in the Y-axis direction. In the present example, the first opening 31 on a dummy base region 30-6 surrounded by the sixth trench portion 40-6 is positioned on the innermost side in the Y-axis direction. Also, the first opening 31 on a dummy base region 30-4 surrounded by the fourth trench portion 40-4 is positioned on the outermost side in the Y-axis direction. The first opening 31 on a dummy base region 30-5 surrounded by the fifth trench portion 40-5 may be positioned between the first opening 31 on the dummy base region 30-4 and the first opening 31 on the dummy base region 30-6 in the Y-axis direction.

The configuration in the present example allows the first opening 31 to be arranged on an outer side in the Y-axis direction as further as possible according to the shape of the trench portion. In this manner, the carrier density in the vicinity of the shorter portion 47 of the trench portion 40 can be reduced. Note that combinations of the present example and the first to fourth embodiments described above may also be applied.

In the present example, second openings 32 on respective dummy base regions 30 are at the same position in the Y-axis direction. However, in the present example, first openings 31 at a corner of the active portion 80 are at different positions in the Y-axis direction, and therefore the distance between a first opening 31 and a second opening 32 varies with the position of the first opening 31 in the Y-axis direction. In the present example, the first opening 31 on the dummy base region 30-4 is positioned on the outermost side in the Y-axis direction, and therefore a distance $L_1$ defined on the dummy base region 30-4 is longer than distances $L_1$ defined on the dummy base regions 30-5 and 30-6. For a similar reason, the distance $L_1$ defined on the dummy base region 30-5 is longer than the distance $L_1$ defined on the dummy base region 30-6. Also, the distance $L_1$ defined on the dummy base region 30-6 is the shortest.

Figure 16:
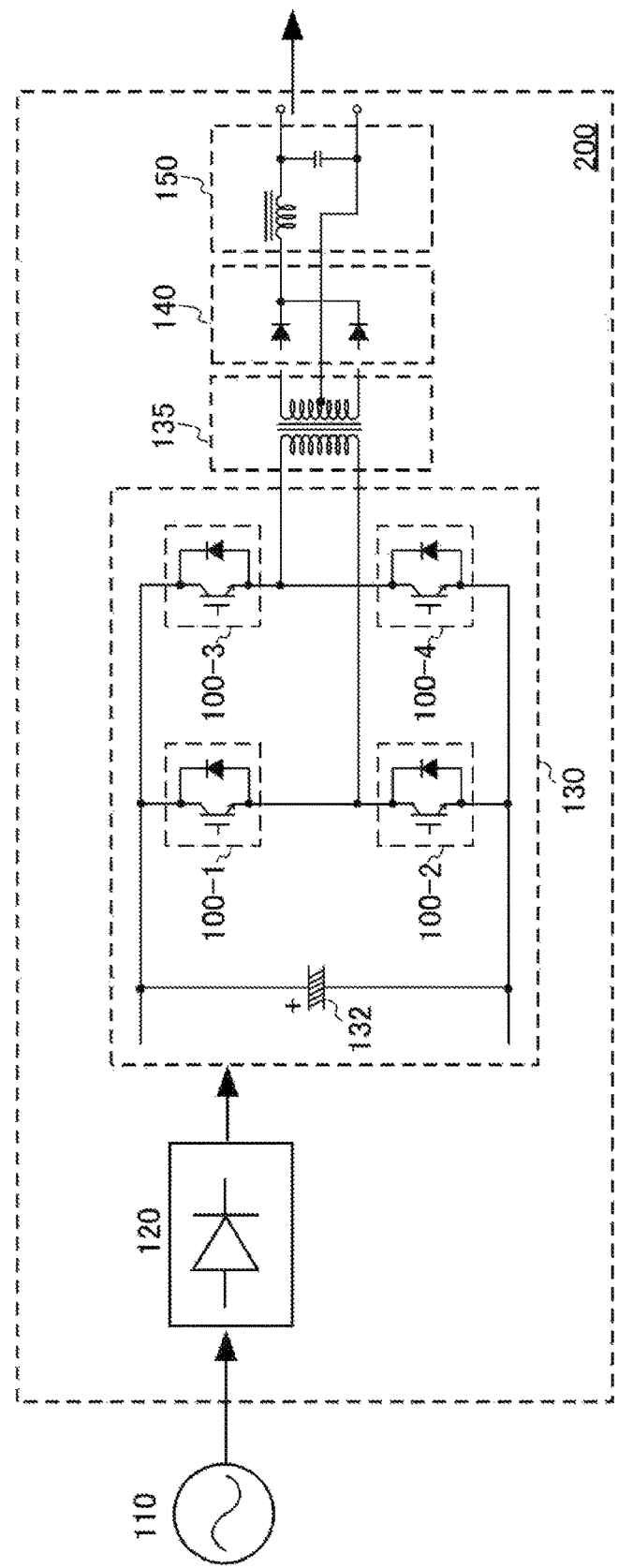
FIG. 16 shows part of a circuit 200 in a welding machine provided with the semiconductor device 100.

FIG. 16 shows part of a circuit 200 in a welding machine provided with the semiconductor device 100. The welding machine in the present example includes a rectifier 120, an inverter 130, a transformer 135, a rectifier 140 and a low-pass filter (LPF) 150. An AC power supply 110 positioned external to the welding machine may input alternating current to the rectifier 120. The rectifier 120 may perform half-wave rectification of the input alternating current, to input the rectified current to the inverter 130.

The inverter 130 has a plurality of semiconductor devices 100 and an electric field capacitor 132. The inverter 130 in the present example is a so-called full-bridge inverter. The inverter 130 may be configured using the semiconductor device 100 (IGBT semiconductor chip and/or RC-IGBT semiconductor chip) described in the above embodiments. Note that the electric field capacitor 132 may appropriately transform input waveforms from the rectifier 120 according to its charged time.

The inverter 130 may convert current input from the rectifier 120 into alternating current by turning on/off the gate of each semiconductor device 100 at a frequency of 20 kHz or more and 100 kHz or less (40 kHz for example). Then, the AC voltage converted by the inverter 130 may be boosted through the transformer 135. The boosted current may pass through the rectifier 140 and the LPF 150 to be used as direct current in a downstream circuit.

With the inverter 130 in the present example, the on/off ratio of the gate is as high as 20 kHz or more and 100 kHz or less. In operation at such a high frequency, a merit of being able to reduce the turn-off loss Eoff in the inverter 130 is significant. In the inverter 130 in the present example, the semiconductor device 100 described above undergoes a low-current turn-on and a low-current turn-off. In this manner, the inverter 130 can enjoy a merit of reducing Eoff in the semiconductor device 100. Note that the semiconductor device 100 described in the above embodiments may be used for an inverter used in a UPS (Uninterruptible Power Supply) that operates at a high frequency.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: front surface, 12: emitter region, 14: base region, 16: contact region, 17: well region, 18: drift region, 19: back surface, 20: FS layer, 22: collector region, 24: collector electrode, 26: oxide film, 28: interlayer insulating film, 30: dummy base region, 31: first opening, 32: second opening, 33: third opening, 35: fourth opening, 37: contact region, 38: outer end, 40: trench portion, 42: trench insulating film, 43: trench conductive portion, 44: trench, 46: longer portion, 47: shorter portion, 51: gate runner, 52: emitter electrode, 54: opening, 55: gate metal layer, 60: mesa region, 71: outer end, 72: inner end, 80: active portion, 90: edge termination structure, 95: pad portion, 100: semiconductor device, 110: AC power supply, 120: rectifier, 130: inverter, 132: electric field capacitor, 135: transformer, 140: rectifier, 150: LPF, 200: circuit

What is claimed is:
1. A semiconductor device comprising:
a semiconductor substrate;
an interlayer insulating film provided on the semiconductor substrate; and
an emitter electrode provided on the interlayer insulating film, wherein the semiconductor substrate includes:
a plurality of "U"-shaped trench portions that are provided from a front surface of the semiconductor substrate in an active portion to a predetermined depth, each of the plurality of "U"-shaped trench portions has a set of two longer portions which extend in parallel in a first direction along a surface of the interlayer insulating film in a view of the semiconductor substrate as seen from above, a shorter portion which extends in a second direction in the view of the semiconductor substrate as seen from above, a first curved portion joining a first end of a first of the two longer portions to a first end of the shorter portion, and a second curved portion joining a first end of a second of the two longer portions and a second end of the shorter portion, each of the two longer portions, the shorter portion, and the first and second curved portions having substantially a same width, the plurality of "U"- shaped trench por- tions including a first "U"-shaped trench portion, a second "U"- shaped trench portion, and a third "U"-shaped trench portion;

a first vertical IGBT device formed between a first of the two longer portions of the first "U"-shaped trench portion and a first of the two longer portions of the second "U"-shaped trench portion, a base of the first vertical IGBT device being of a first conductivity-type;

a second vertical IGBT device formed between a second of the two longer portions of the second "U"-shaped trench portion and a first of the two longer portions of the third "U"-shaped trench portion, a base of the second vertical IGBT device being of the first conductivity-type; and a dummy-base region of the first conductivity-type that includes a contact region that is in direct contact with the emitter electrode, the dummy-base region being surrounded by the second "U"-shaped trench portion, the interlayer insulating film includes:

a single column of openings lined up in the first direction between the two longer portions of the second "U"-shaped trench portion, each opening of the single column of openings being in a center between the two longer portions of the second "U"-shaped trench portion, the single column of openings including:

a first opening of the single column of openings that is closest to the shorter portion of the dummy base region second "U"-shaped trench portion, a second opening of the single column of openings that is second closest to the shorter portion of the second "U"-shaped trench portion, and a third opening of the single column of openings that is third closest to the shorter portion of the second "U"-shaped trench portion; wherein the emitter electrode directly contacts the contact region in the dummy- base region through the first opening, the second opening, and the third opening, and a distance between a center of the first opening and a center of the second opening is shorter than a distance between the center of the second opening and a center of the third opening.

2. The semiconductor device according to claim 1, wherein the single column of openings in the interlayer insulating film further includes one or more additional openings that are farther from the shorter portion of the second "U"-shaped trench portion than the third opening, the emitter electrode directly contacting the contact region in the dummy-base region through the one or more additional openings, and the distance between the center of the first opening and the center of the second opening is shorter than distances between centers of every adjacent two openings among the second opening, the third opening, and the one or more additional openings.

3. The semiconductor device according to claim 1, wherein an opening area of the first opening is greater than an opening area of the second opening and greater than an opening area of the third opening.

4. The semiconductor device according to claim 1, wherein, in the view of the semiconductor substrate as seen from above, the first opening is substantially rectangular, and a first edge closest to the shorter portion of the second "U"-shaped trench portion is parallel to the shorter portion of the second "U"-shaped trench portion.

5. The semiconductor device according to claim 1, wherein, in the view of the semiconductor substrate as seen from above, the first opening is substantially rectangular, and a first edge closest to the shorter portion of the second "U"-shaped trench portion extends in the second direction.

6. The semiconductor device according to claim 1, wherein, in the view of the semiconductor substrate as seen from above, the second opening and the third opening are each substantially rectangular, and each have a long side in the first direction.

7. The semiconductor device according to claim 1, wherein the semiconductor substrate further includes a well region of the first conductivity-type and that is provided from the front surface to a deeper position than the second "U"-shaped trench portion, and is provided extending from the shorter portion of the second "U"- shaped trench portion to a position directly below the first opening.

8. The semiconductor device according to claim 1, wherein, in the view of the semiconductor substrate as seen from above, a distance, in the first direction, between the first opening and the shorter portion of the second "U"-shaped trench portion is shorter than a distance, in the first direction, between an emitter region of a second conductivity-type and the shorter portion of the second "U"-shaped trench portion, the emitter region being an emitter region of the first vertical IGBT device or the second vertical IGBT device.

9. The semiconductor device according to claim 1, wherein the contact region is of the first conductivity-type.

10. The semiconductor device according to claim 1, wherein the first vertical IGBT device further includes:

a collector region of the first conductivity-type and occupying a back surface of the semiconductor substrate;

a field stop layer of a second conductivity-type and provided farther away from the back surface of the semiconductor substrate than the collector region; and a drift region of the second conductivity-type and provided on the field stop layer and contacts a bottom portion of the first "U"-shaped trench portion, wherein the field stop layer has one or more peaks of doping concentration in a depth direction, and one of the one or more peaks of doping concentration that is closest to the front surface is at a distance of 5 μm or more from the back surface.

11. The semiconductor device according to claim 1, wherein the distance between the center of the second opening and the center of the third opening is 50 μm or more and 100 μm or less.

12. The semiconductor device according to claim 1, wherein the interlayer insulating film further includes a plurality of additional openings farther from the shorter portion of the second "U"-shaped trench portion than the third opening, and the emitter electrode directly contacts the contact region in the dummy-base region at the first opening, the second opening, the third opening, and the plurality of additional openings.

13. The semiconductor device according to claim 1, wherein the single column of openings in the interlayer insulating film further includes a fourth opening that is fourth closest to the shorter portion of the second "U"-shaped trench portion, the emitter electrode directly contacting the contact region in the dummy- base region through the fourth opening, and the distance between the center of the first opening and the center of the second opening is shorter than a distance between the center of the third opening and a center of the fourth opening.

14. The semiconductor device according to claim 1, wherein the first opening, the second opening, and the third opening are aligned in a straight line.

\* \* \* \* \*